United States Patent
Ren et al.

(10) Patent No.: US 10,930,834 B2
(45) Date of Patent: Feb. 23, 2021

(54) SYNTHESIS OF N-TYPE THERMOELECTRIC MATERIALS, INCLUDING MG—SN—GE MATERIALS, AND METHODS FOR FABRICATION THEREOF

(71) Applicant: University of Houston System, Houston, TX (US)

(72) Inventors: Zhifeng Ren, Houston, TX (US); Weishu Liu, Houston, TX (US)

(73) Assignee: University of Houston System, Houston, TX (US)

( * ) Notice: Subject to any disclaimer, the term of this patent is extended or adjusted under 35 U.S.C. 154(b) by 459 days.

(21) Appl. No.: 15/547,374

(22) PCT Filed: Dec. 10, 2015

(86) PCT No.: PCT/US2015/065119
§ 371 (c)(1),
(2) Date: Oct. 14, 2017

(87) PCT Pub. No.: WO2016/130205
PCT Pub. Date: Aug. 18, 2016

(65) Prior Publication Data
US 2018/0047886 A1  Feb. 15, 2018

Related U.S. Application Data

(60) Provisional application No. 62/166,887, filed on May 27, 2015, provisional application No. 62/113,655, filed on Feb. 9, 2015.

(51) Int. Cl.
| | |
|---|---|
| *H01L 35/26* | (2006.01) |
| *H01L 35/34* | (2006.01) |
| *C22C 1/04* | (2006.01) |
| *H01L 35/22* | (2006.01) |
| *H01L 35/16* | (2006.01) |
| *C22C 23/00* | (2006.01) |
| *B22F 3/14* | (2006.01) |
| *B22F 3/24* | (2006.01) |
| *B22F 9/04* | (2006.01) |
| *C22C 13/00* | (2006.01) |

(52) U.S. Cl.
CPC ............... *H01L 35/26* (2013.01); *B22F 3/14* (2013.01); *B22F 3/24* (2013.01); *B22F 9/04* (2013.01); *C22C 1/04* (2013.01); *C22C 1/0483* (2013.01); *C22C 13/00* (2013.01); *C22C 23/00* (2013.01); *H01L 35/16* (2013.01); *H01L 35/22* (2013.01); *H01L 35/34* (2013.01); *B22F 2003/248* (2013.01); *B22F 2009/043* (2013.01); *B22F 2301/30* (2013.01); *B22F 2998/10* (2013.01); *C22C 1/0408* (2013.01)

(58) Field of Classification Search
CPC .......... H01L 35/20; H01L 35/34; C22C 1/04; C22C 1/0483; C22C 1/0408; C22C 23/00; B22F 3/14; B22F 3/24; B22F 9/04; B22F 2003/248; B22F 2003/2301; B22F 2009/043

See application file for complete search history.

(56) References Cited

U.S. PATENT DOCUMENTS

| | | | |
|---|---|---|---|
| 8,865,995 B2 | 10/2014 | Ren et al. | |
| 9,666,782 B2 * | 5/2017 | Isoda | ........................ B22F 3/14 |
| 10,468,577 B2 * | 11/2019 | Nakada | ................... C22C 23/00 |
| 2009/0211619 A1 | 8/2009 | Sharp et al. | |
| 2010/0051081 A1 | 3/2010 | Iida et al. | |
| 2012/0118343 A1 | 5/2012 | Iida et al. | |
| 2013/0234375 A1 * | 9/2013 | Ren | ......................... H01L 35/34 |
| | | | 264/614 |

FOREIGN PATENT DOCUMENTS

| | | | |
|---|---|---|---|
| EP | 2770069 | * | 8/2014 |
| EP | 2770069 A1 | | 8/2014 |
| WO | WO2010/112956 | * | 10/2010 |
| WO | WO 2015/012113 | * | 1/2015 |

OTHER PUBLICATIONS

PCT/US2015/065119 International Search Report and Written Opinion dated Jun. 15, 2016 (16 p.).

* cited by examiner

*Primary Examiner* — C Melissa Koslow
(74) *Attorney, Agent, or Firm* — Conley Rose, P.C.

(57) ABSTRACT

Discussed herein are systems and methods for fabrication of MgSnGe-based thermoelectric materials for applications from room temperature and near room temperature to high temperature applications. The TE materials may be fabricated by hand or ball milling a powder to a predetermined particle size and hot-pressing the milled powder to form a thermoelectric component with desired properties including a figure of merit (ZT) over a temperature range. The TE materials fabricated may be disposed in thermoelectric devices for varying applications.

10 Claims, 36 Drawing Sheets

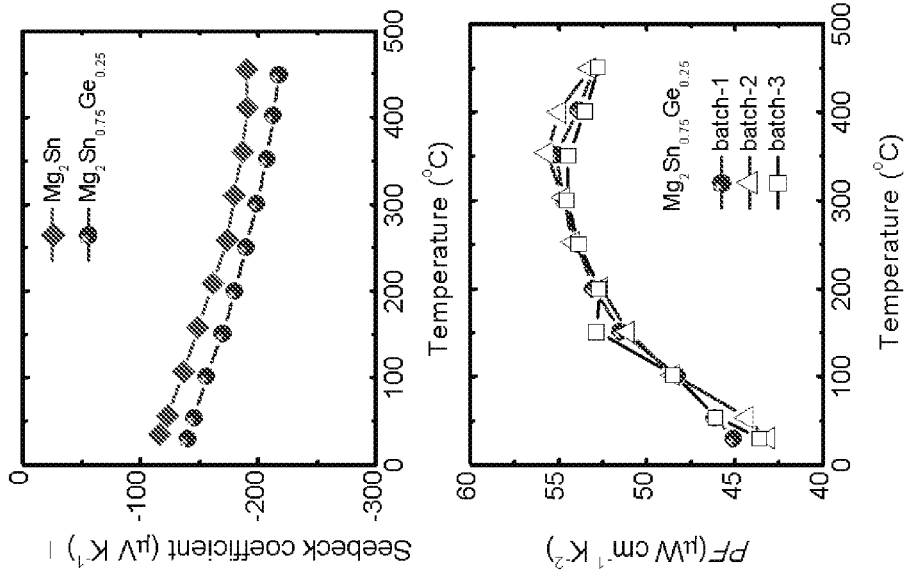
FIG. 4B
FIG. 4A
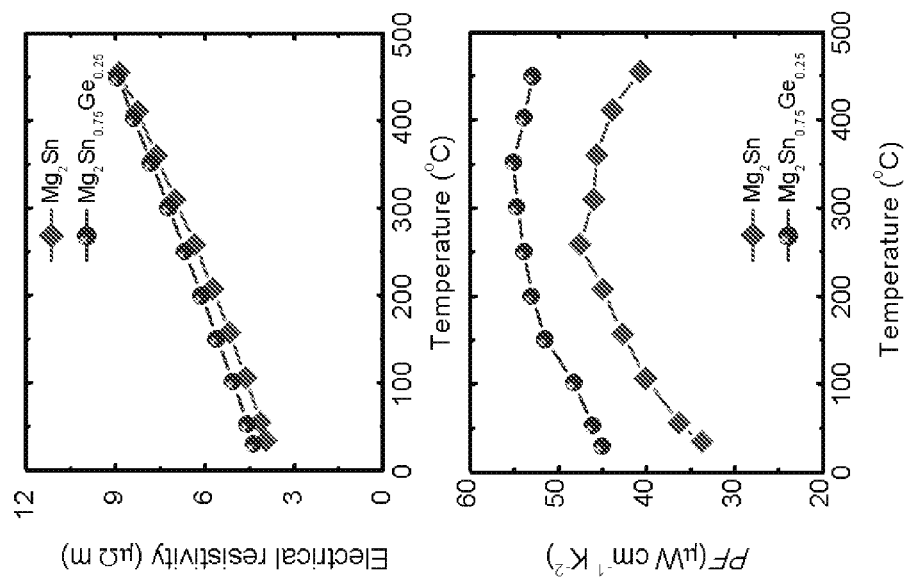
FIG. 4D
FIG. 4C

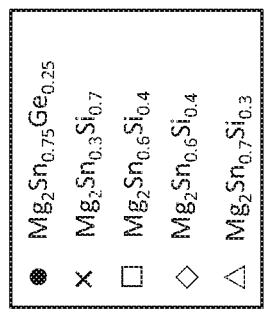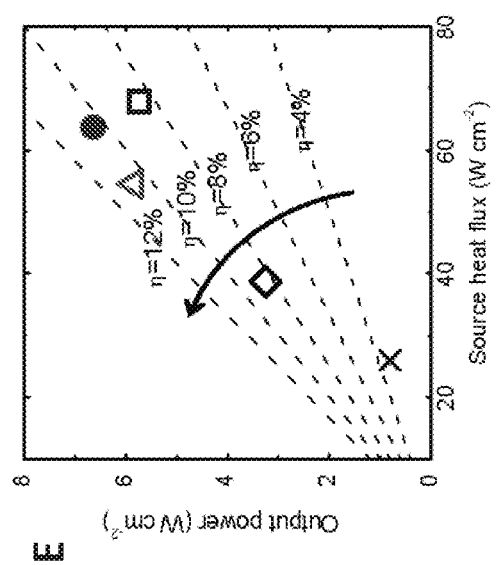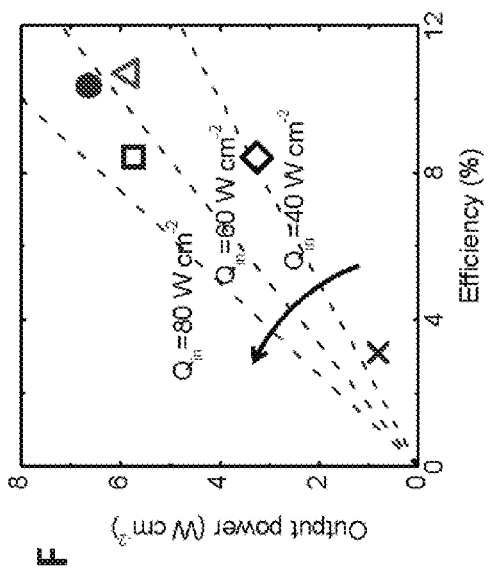
FIG. 6E
FIG. 6F

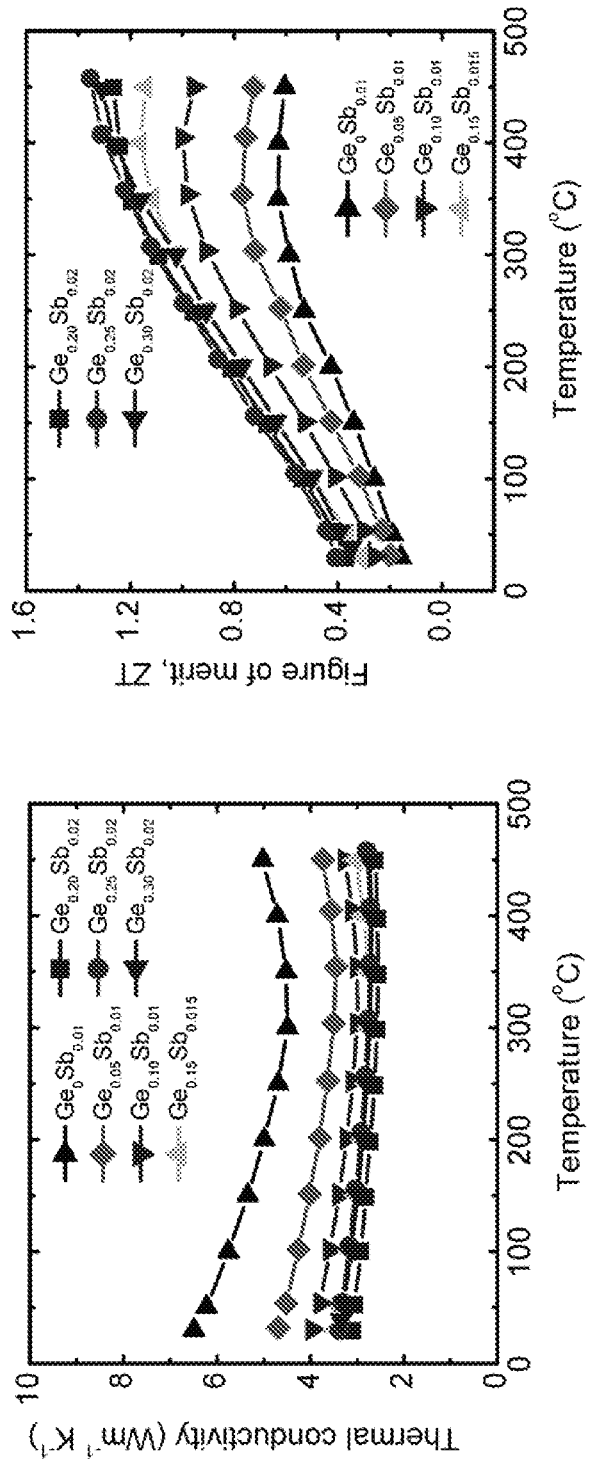

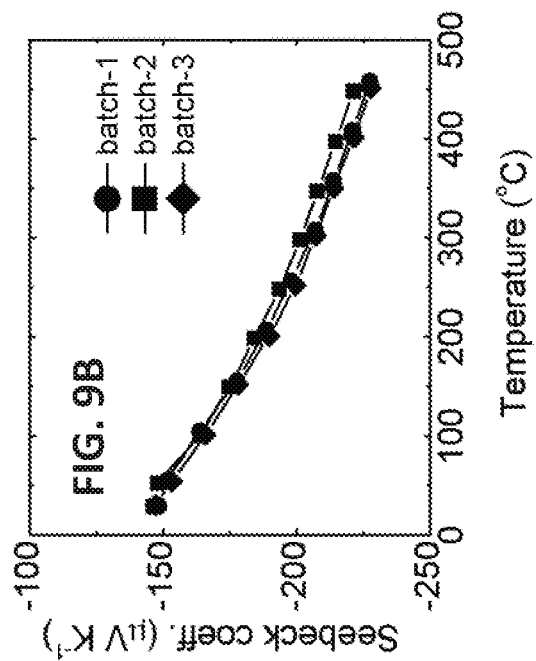
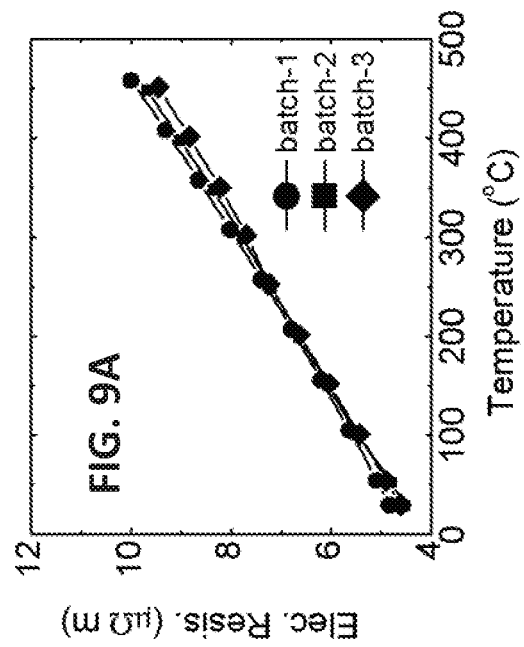
FIG. 9A
FIG. 9B

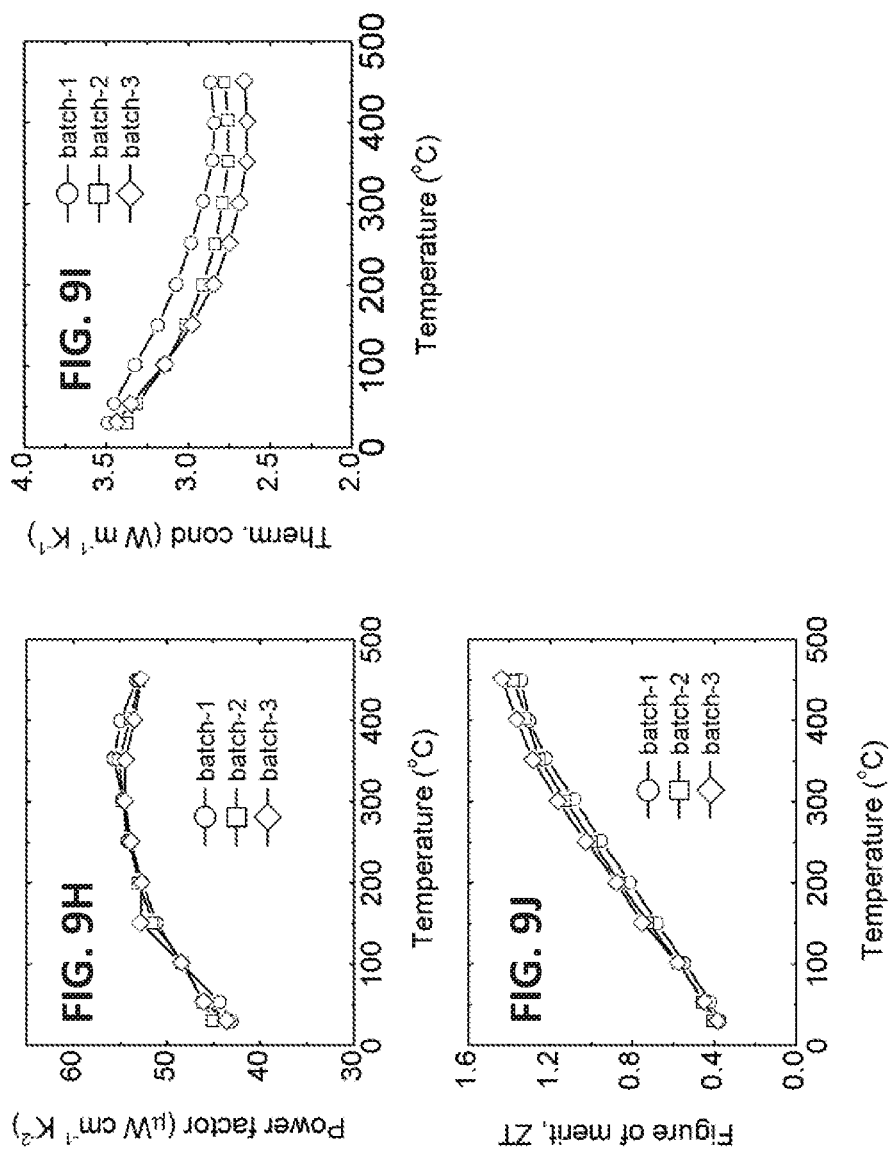

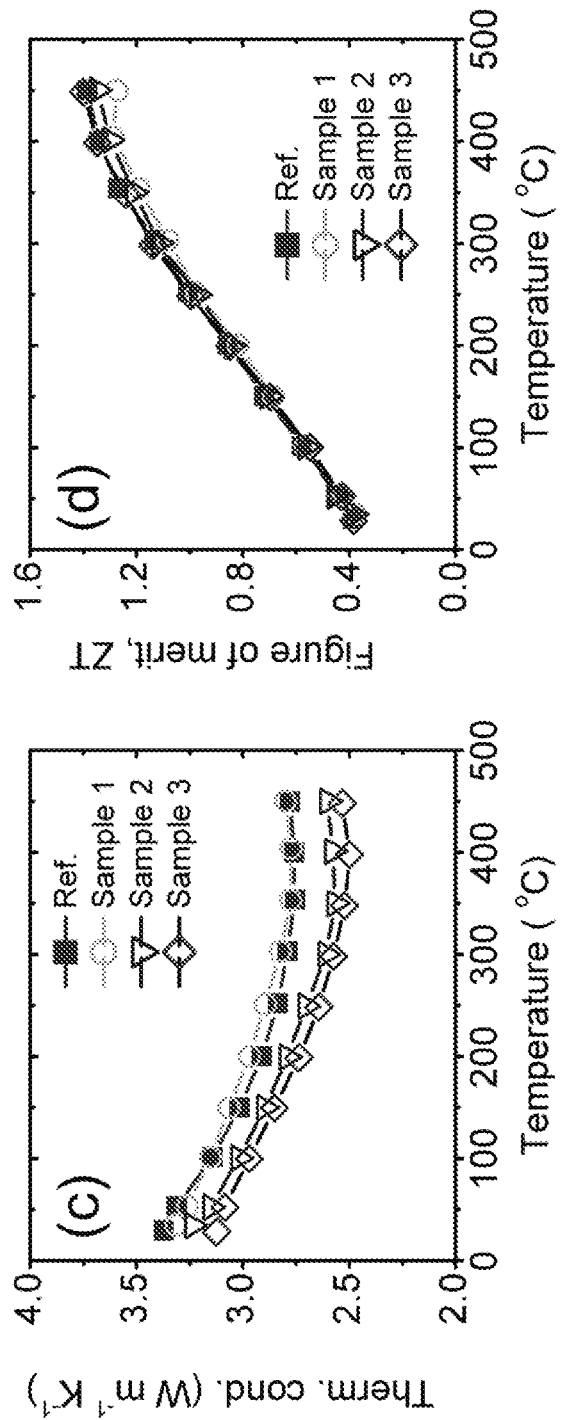

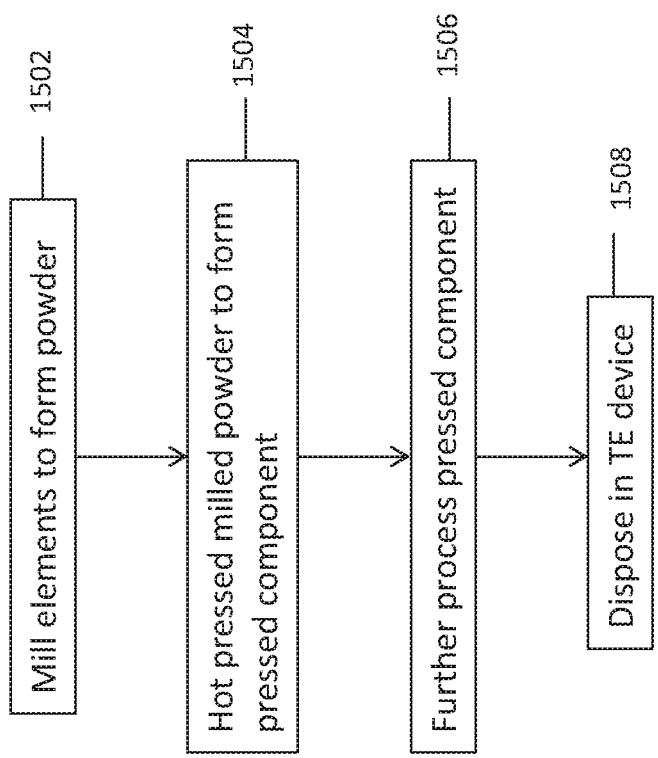

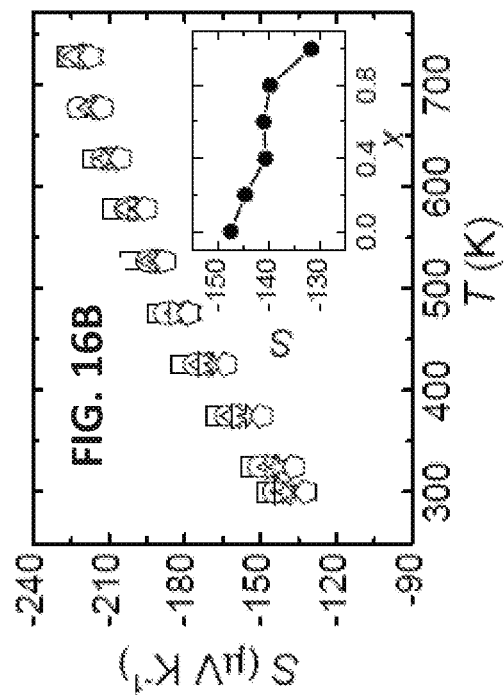
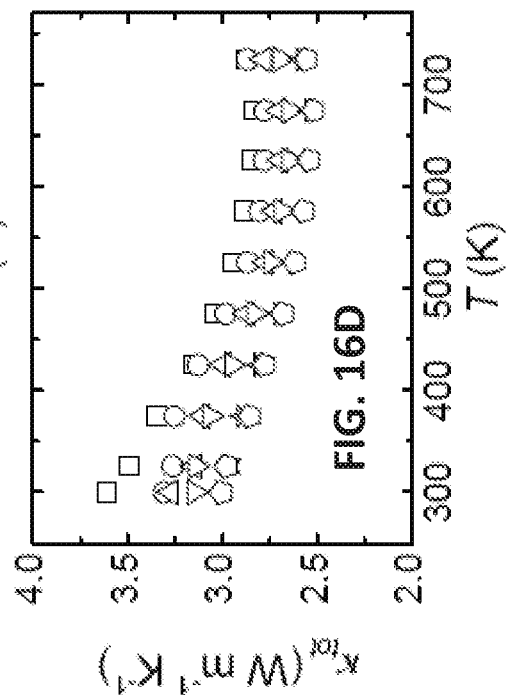
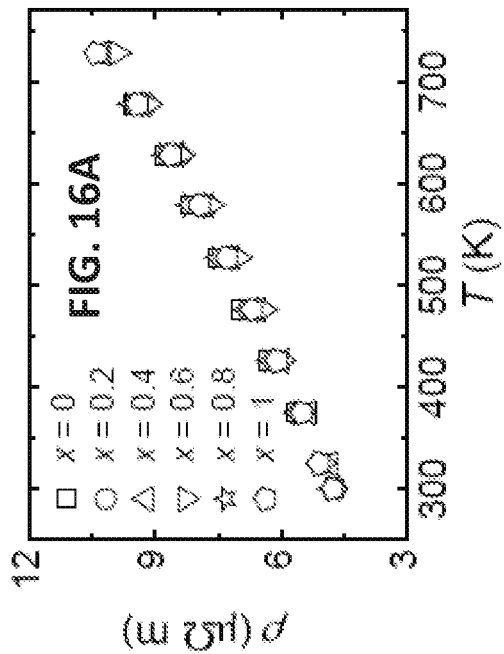
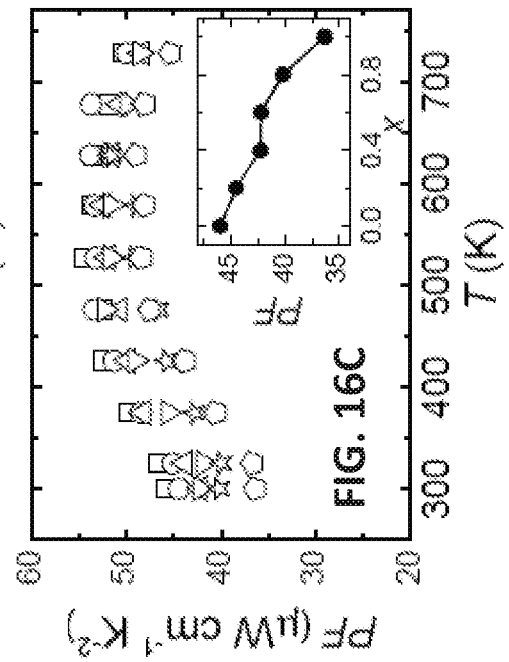

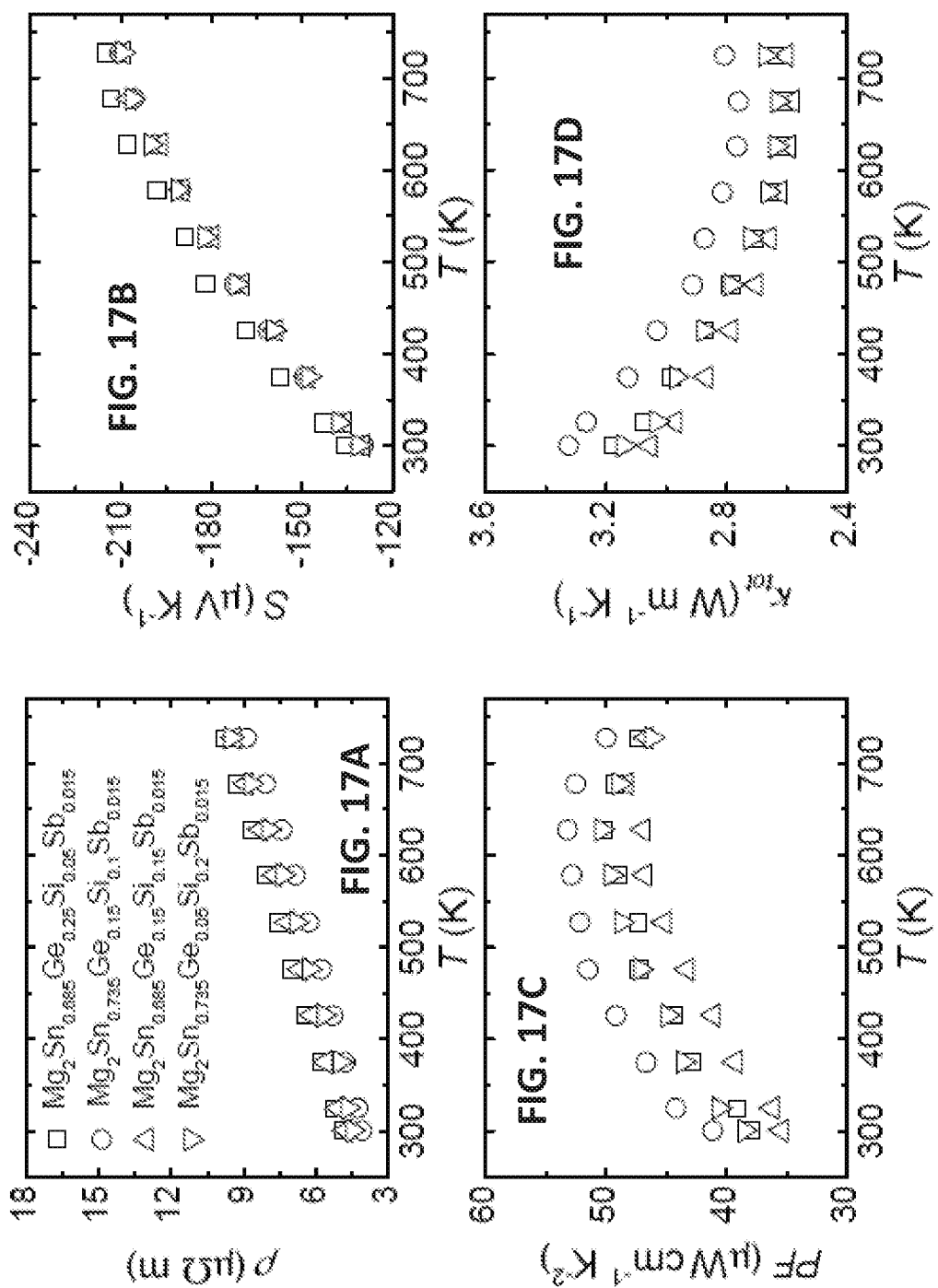

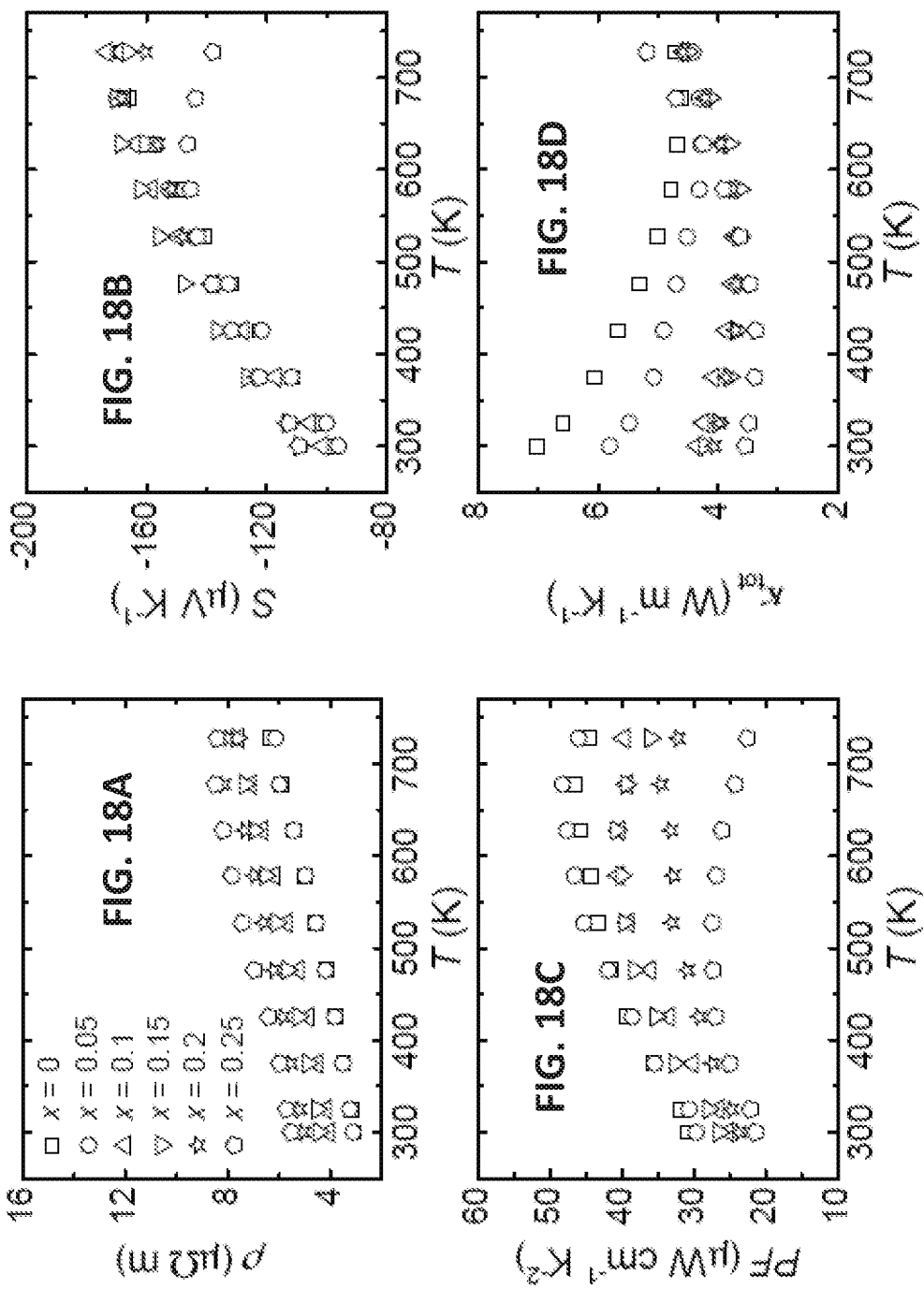

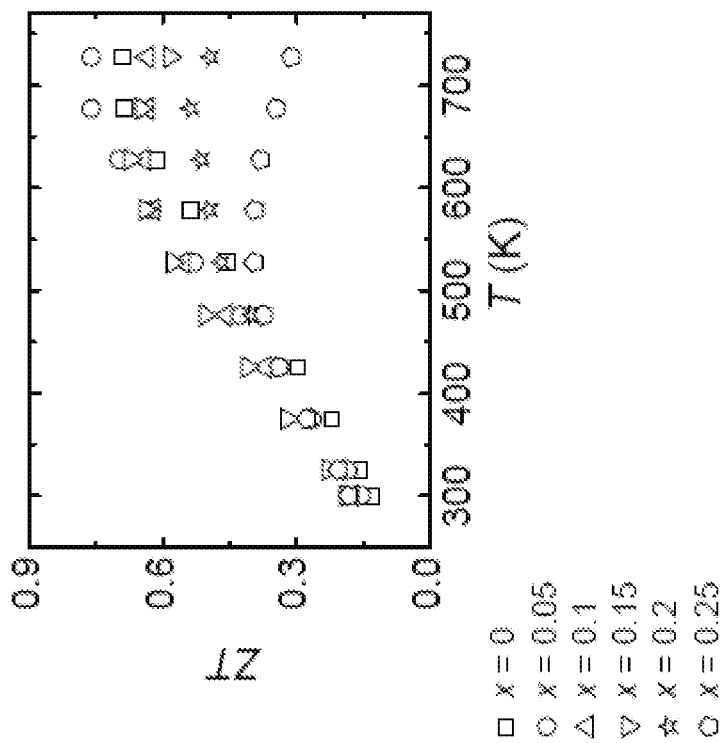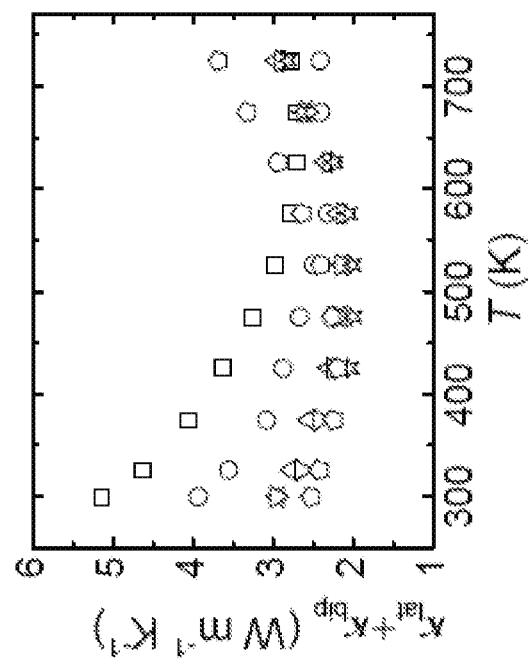
FIG. 18F
FIG. 18E

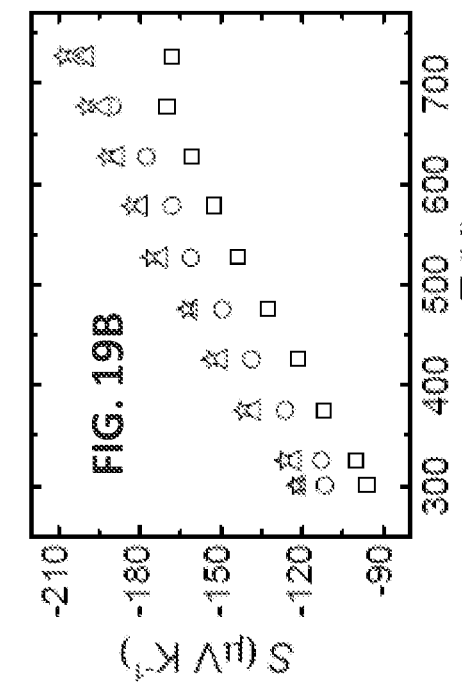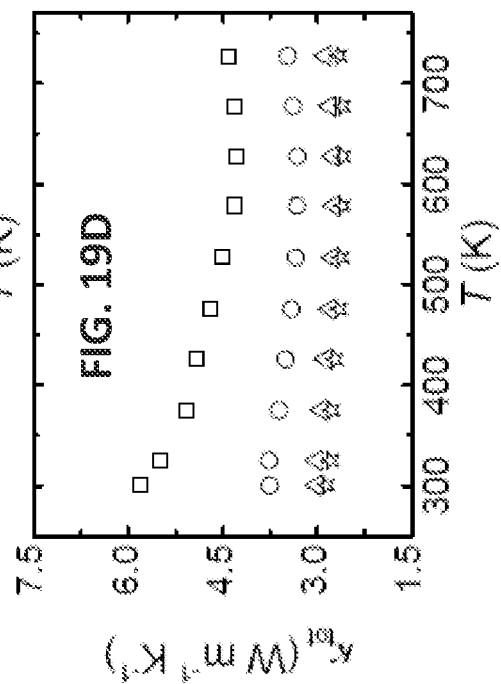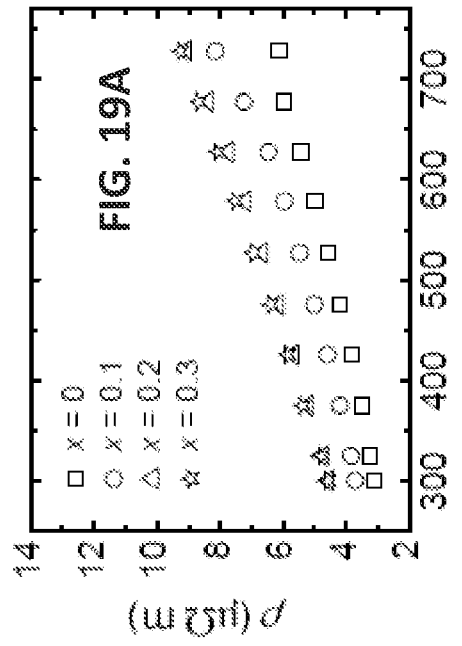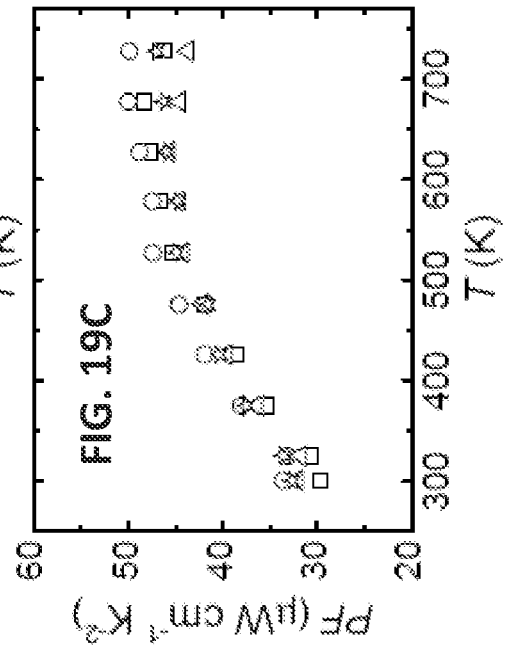

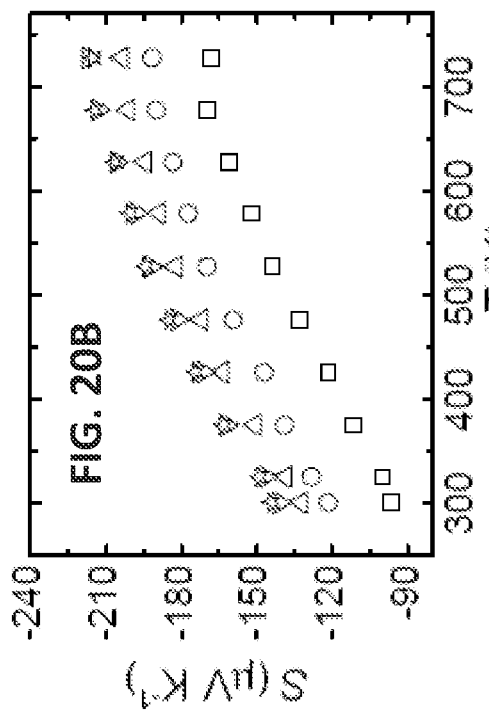
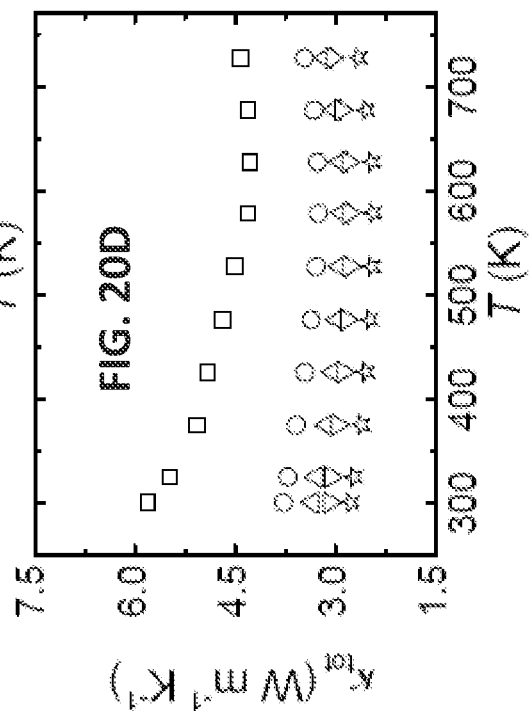
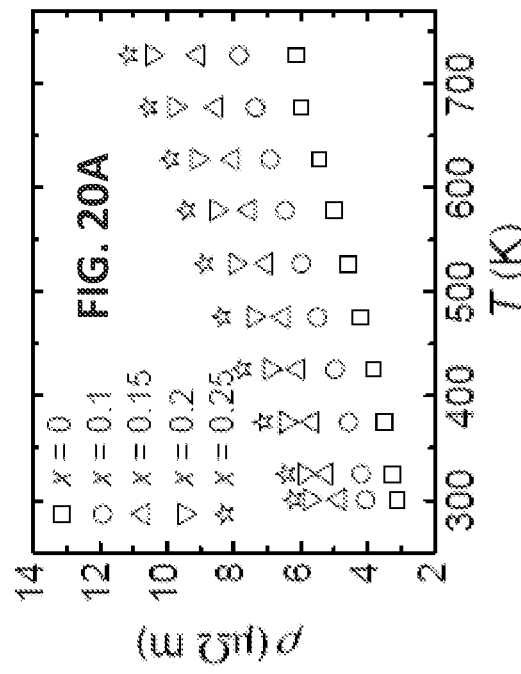
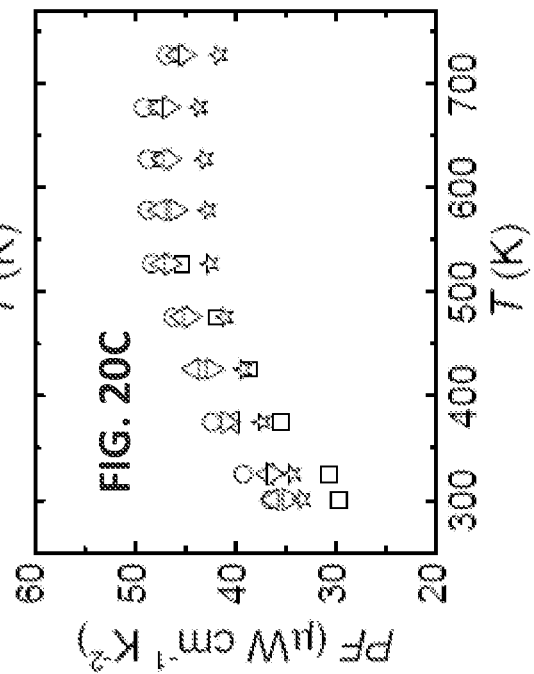

SYNTHESIS OF N-TYPE THERMOELECTRIC MATERIALS, INCLUDING MG—SN—GE MATERIALS, AND METHODS FOR FABRICATION THEREOF

CROSS-REFERENCE TO RELATED APPLICATIONS

This application is a 35 U.S.C. § 371 national stage application of PCT/US2015/065119 filed Dec. 10, 2015, and entitled "Synthesis of N-Type Thermoelectric Materials, Including Mg—Sn—Ge Materials, and Methods for Fabrication Thereof," which claims priority to U.S. Prov. App. No. 62/113,655, "New N-Type Thermoelectric Material $Mg_2$(Sn, Ge, Si) and Method for Synthesis Thereof," filed Feb. 9, 2015 and U.S. Prov. App. No. 62/166,887, "Synthesis of N-type Thermoelectric Materials, Including Mg—Sn—Ge Materials," filed May 27, 2015, each of which are incorporated by reference herein in their entirety for all purposes.

STATEMENT REGARDING FEDERALLY SPONSORED RESEARCH OR DEVELOPMENT

This work is partially supported by "Solid State Solar-Thermal Energy Conversion Center ($S^3$TEC)", an Energy Frontier Research Center funded by the U.S. Department of Energy, Office of Science, Office of Basic Energy Science under award number DE-SC0001299/DE-FG02-09ER46577 (materials synthesis and characterizations), and partially by "Concentrated Solar Thermoelectric Power (CSP)", a DOE SunShot CSP grant, under award number DE-EE0005806 (leg efficiency and output power density calculation). The work is also supported in part by U.S. Air Force Office of Scientific Research Grant No. FA9550-09-1-0656.

BACKGROUND

Over the past decades, thermoelectric materials have been extensively studied for potentially broad applications in refrigeration, waste heat recovery, solar energy conversion, etc. The efficiency of thermoelectric devices is governed by the materials' dimensionless figure of merit $ZT=(S^2\sigma/\kappa)T$, where S, $\sigma$, T, and $\kappa$ are the Seebeck coefficient, electrical conductivity, absolute temperature, and thermal conductivity, respectively.

BRIEF SUMMARY OF THE DISCLOSURE

In an embodiment, a method of manufacturing a thermoelectric material comprising: hot-pressing a powder comprising a first component (W) and a second component (X) into a pressed component, wherein the pressed component comprises a ZT value of at least 1.0 at about 450° C., wherein the first component is one of magnesium (Mg), calcium (Ca), strontium (Sr), barium (Ba), zinc (Zn), and (ytterbium) Yb, and the second component is one of tin (Sn), germanium (Ge), silicon (Si), lead (Pb).

In an embodiment, a thermoelectric device comprising: a thermoelectric material comprising a first component W, a second component X, a third component Y, and a fourth component Q, according to the formula $W_{2+\delta}X_{1-x-y}Y_xQ_y$, and comprising a ZT of about 1.4 at about 450° C., wherein the third component Y comprises Si, Ge, Sn, or Pb, and the fourth component Q comprises Bi, Sb, As, P, S, Se, or Te.

In another embodiment, thermoelectric device comprising: a thermoelectric material comprising: magnesium (Mg), a second component (X), and a third component (Y), according to the formula $W_AX_BY_C$, and a ZT value of at least 1.0 at about 450° C.

BRIEF DESCRIPTION OF THE DRAWINGS

For a detailed description of the exemplary embodiments disclosed herein, reference will now be made to the accompanying drawings in which:

FIGS. 4A-4D are graphs of temperature dependent thermoelectric properties of samples of $Mg_2Sn$ and $Mg_2Sn_{0.75}Ge_{0.25}$ fabricated according to certain embodiments of the present disclosure.

FIGS. 6A-6F illustrate thermoelectric temperature-dependent properties of a plurality of MgSnGe-based samples fabricated according to certain embodiments of the present disclosure as compared to conventional samples.

FIGS. 7A-7F illustrate shows the temperature dependent thermoelectric properties of the $Mg_{2+\delta}Sn_{1-x-y}Ge_xSb_y$ samples fabricated according to embodiments of the present disclosure.

FIGS. 9A-9J show the three batches of samples of $Mg_{2+\delta}Sn_{0.75-y}Ge_{0.25}Sb_y$ at two different carrier concentration, i.e. $2.7\times10^{20}$ $cm^{-3}$ (FIGS. 9A-9E) and $3.0\times10^{20}$ $cm^{-3}$ (FIGS. 9F-9J), respectively.

FIGS. 10A-10D are graphs illustrating the comparative temperature-dependent thermoelectric properties for a reference sample as compared to samples of thermoelectric materials fabricated according to embodiments of the present disclosure.

FIG. 15 is a flow chart of a method of manufacturing thermoelectric materials and thermoelectric devices according to certain embodiments of the present disclosure.

FIGS. 16A-16F are graphs of temperature-dependent thermoelectric properties of $Mg_2(Sn_{0.765}Ge_{0.22}Sb_{0.015})_{1-x}(Sn_{0.685}Si_{0.3}Sb_{0.015})_x$ fabricated according to certain embodiments of the present disclosure.

FIGS. 17A-17F are additional graphs of temperature-dependent thermoelectric properties of $Mg_2(Sn_{0.765}Ge_{0.22}Sb_{0.015})_{1-x}(Sn_{0.685}Si_{0.3}Sb_{0.015})_x$ fabricated according to certain embodiments of the present disclosure.

FIGS. 18A-18F are graphs of temperature-dependent thermoelectric properties of $Mg_2Sn_{0.98-x}Pb_xSb_{0.02}$ fabricated according to certain embodiments of the present disclosure.

FIGS. 19A-19F are graphs of temperature-dependent thermoelectric properties of $Mg_2Sn_{0.98-x}Si_xPb_{0.05}Sb_{0.02}$ fabricated according to certain embodiments of the present disclosure.

FIGS. 20A-20F are additional graphs of temperature-dependent thermoelectric properties of $Mg_2Sn_{0.98-x}Si_xPb_{0.05}Sb_{0.02}$ fabricated according to certain embodiments of the present disclosure.

DETAILED DESCRIPTION OF THE DISCLOSED EXEMPLARY EMBODIMENTS

Figures 1A, 1B:
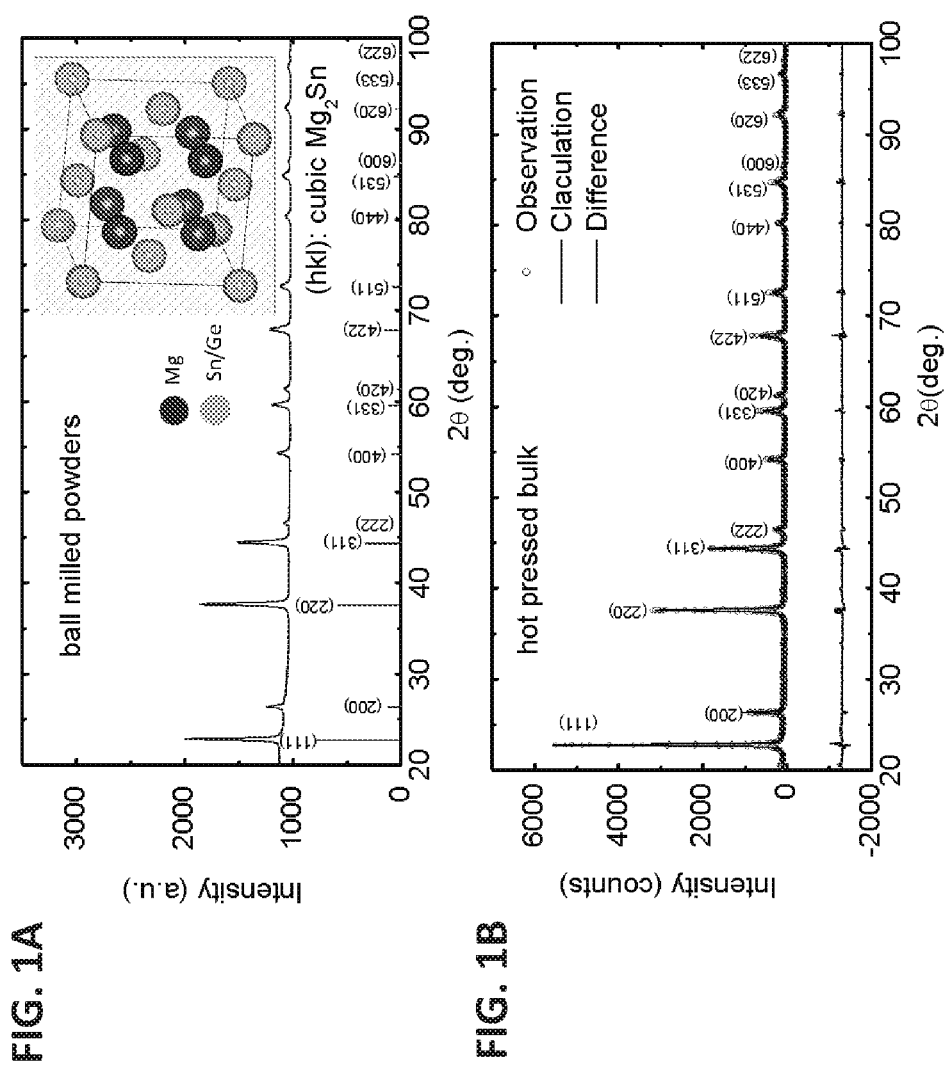
FIGS. 1A and 1B are x-ray diffraction (XRD) patterns of a plurality of $Mg_2Sn$ samples fabricated according to certain embodiments of the present disclosure.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

Thermoelectric (TE) materials are useful for power generation and/or cooling applications because of the electric voltage that develops when a temperature differential is created across the material. TE cooling systems operate on the principal that a loop (circuit) of at least two dissimilar materials can pass current, absorbing heat at one end of the junction between the materials and releasing heat at the other end of the junction, and TE power generators enable the direct conversion from heat to electricity. As such, TE materials may be fabricated so that, when heat is applied to a portion of the TE material, the electrons migrate from the hot end towards a "cold" end, e.g., a portion of the TE material where heat is not being applied. The electrical current created when the electrons migrate may be harnessed for power, and the amount of electrical current (and resultant power generated) increases with an increasing temperature difference from the hot side of the TE material to the cold side. However, when a TE material is heated up, if it is heated for a long enough time period, held at a temperature over a time period, and/or heated to a high enough temperature, the cold side may actually heat up, so the thermoelectric devices in which the TE materials are employed may also use various methods to pull heat away from the cold side.

In an embodiment, materials for thermoelectric generators are fabricated to possess high dimensionless figure of merit $ZT=[S^2\sigma/(\kappa_e+\kappa_L)]T$, where S, $\sigma$, $\kappa_e$, $\kappa_L$, and T are the Seebeck coefficient, electrical conductivity, electronic thermal conductivity, lattice thermal conductivity, and absolute temperature, respectively. The thermoelectric effect is a combination of phenomenon including the Seebeck effect, Peltier effect, and Thomson effect. The Seebeck coefficient is associated with the Seebeck effect, which is the name of the effect observed when an electromagnetic effect is created when a structure (loop) is heated on one side. The Peltier effect is the term used to explain heating or cooling at a junction between two different TE materials when a current is generated in a circuit or other loop comprising the two different TE materials. The Thomson effect occurs when a Seebeck coefficient is not constant at a temperature (depending upon the TE material), so when an electric current is passed through a circuit of a single TE material that has a temperature gradient along its length, heat may be absorbed, and the temperature difference may be redistributed along the length when the current is applied. Thus, higher ZT values for TE materials across a variety of temperature ranges may continue to become increasingly valuable for applications at least across the fields of TE power generation and cooling.

Thermoelectric power generation and the related efficacy refers to the use of a thermal gradient formed between conductors that generates a voltage. The temperature gradient formed results in a heat flow, and some of the heat generated associated with the head flow may not be converted into voltage. The Seebeck coefficient may be employed to determine the effectiveness of a material for thermoelectric applications including cooling or power generation. In order to develop more thermoelectrically efficient materials, it may be desirable to fabricate materials with a high Seebeck coefficient and a high power factor, which is the ability of a material to produce electric power. As discussed herein, for a given ZT, higher power factor ($S^2\sigma$) instead of lower $\kappa$ should be pursued for achieving more power since power is determined by $(T_h-T_c)^2(S^2\sigma)/L$, where $T_h$, $T_c$, and L are the hot and cold side temperatures, and leg length, respectively. A new material $Mg_2Sn_{0.75}Ge_{0.25}$ is fabricated herein comprising both a high ZT and a high power factor.

Thermoelectric power generation is one of the most promising techniques to utilize the huge amount of waste heat and solar energy. Traditionally, high thermoelectric figure-of-merit, ZT, has been the only parameter pursued for high conversion efficiency. A high power factor (PF) is equivalently desirable for high power generation, in addition to high efficiency. A new n-type $Mg_2Sn$-based material $Mg_2Sn_{0.75}Ge_{0.25}$ is a good example to meet the dual requirements in efficiency and output power. It was found that $Mg_2Sn_{0.75}Ge_{0.25}$ has an average ZT of 0.9 and PF of 52 $\mu W$ $cm^{-1}$ $K^{-2}$ over the temperature range of 25-450° C., a peak ZT of 1.4 at 450° C., and peak PF of 55 $\mu W$ $cm^{-1}$ $K^{-2}$ at 350° C. By using the energy balance of one-dimensional heat flow equation, leg efficiency and output power were calculated with $T_h$=400° C. and $T_c$=50° C. to be of 10.5% and 6.6 W $cm^{-2}$ under a temperature gradient of 150° C. $mm^{-1}$, respectively.

Technology: Thermoelectric power generation from waste heat is attracting more and more attention. Potential fuel efficiency enhancement by recovering the waste heat is beneficial for automobiles and many other applications. In addition, solar thermoelectric generators (STEG) provide an alternative route to convert solar energy into electrical power besides the photovoltaic conversion. Thermoelectric generator (TEG) is similar to a heat engine using electrons/holes as the energy carrier. The conversion efficiency of a TEG is related to the Carnot efficiency and the material's average thermoelectric figure of merit ZT, $$\eta = \frac{T_h - T_c}{T_h}\left(\frac{\sqrt{1+ZT}-1}{\sqrt{1+ZT}+T_c/T_h}\right) \quad [1]$$

where $ZT=(S^2\sigma/\kappa)T$, and S, $\sigma$, $\kappa$, and T are Seebeck coefficient, electrical conductivity, thermal conductivity, and averaged temperature between $T_c$ and $T_h$, respectively. For practical applications of thermoelectric materials, efficiency is not the only concern, high output power density is also desirable when the capacity of the heat source is huge (such as solar heat), or the cost of the heat source is not a big factor (such as waste heat from automobiles, steel industry, etc.). The output power density $\omega$ is defined as the output power W divided by the cross-sectional area A of the leg, i.e., $\omega=W/A$, which is related to power factor $PF=S^2\sigma$ by $$\omega = \frac{1}{4}\frac{(T_h - T_c)^2}{L}PF \quad [2]$$

Eq. 2 contains two main parts: square of the temperature difference divided by leg length, and material power factor $PF=S^2\sigma$. In order to achieve a higher power density for a given heat source the power factor PF may be increased and/or the leg length may be decreased. However, in some applications, decreasing the leg length could cause severe consequences such as increase of large heat flux that will increase the cost of the heat management at the cold end, increase of percentage of contact resistance in the device that will increase the parasitic loss and consequently decrease the energy conversion efficiency, increase of the thermal stress due to the larger thermal gradient leading to device failure, etc. Therefore, in some embodiments, it may be prudent to increase the power factor PF. Since PF is a pure material parameter, it may be used as a criterion in searching for new thermoelectric materials for high output power.

A "useful" (e.g., a material comprising properties desirable for end power/heat generation/cooling or other applications) thermoelectric material is one which possesses a high ZT value for high efficiency, and also a high PF for high output power. Ideally, the temperature-independent ZT and PF over the whole temperature range from cold side to hot side are desired. However, both the ZT and PF of all materials show strong temperature dependency, usually increasing first with temperature due to the phonon-phonon scattering and then decreasing when the bipolar effect starts to play a role. Since both efficiency and output power may be desirable properties of a thermoelectric material, new n- and p-type materials that can work up to 400° C. are more desirable for thermoelectric power generation.

Discussed herein is the fabrication of a new $Mg_2Sn$-based n-type thermoelectric material operable for thermoelectric applications below about 400° C. for power generation due to the narrow band gap of about 0.26 eV. The challenges in preparing and handling conventionally employed materials include the high vapor pressure and chemical activity of Mg.

$Mg_2Sn$-based materials with ZT values that are desirable in thermoelectric application were fabricated by ball milling and hot pressing as discussed herein. An Sn dominated composition $Mg_2Sn_{0.75}Ge_{0.25}$ was manufactured through ball milling and hot pressing to achieve a ZT of about 1.4 at about 450° C. and power factor PF of about 55 $\mu W\ cm^{-1}\ K^{-2}$ at about 350° C. Calculations show that these could yield a leg efficiency $\eta$ of 10.5%, and output power density $\omega$ of 6.6 $W\ cm^{-2}$ at $T_h=400°$ C. and $T_c=50°$ C., which will be very useful for the vast amount of waste heat sources at up to 400° C. as well as concentrated solar energy conversion applications. The composition of $Mg_2Sn_{0.75}Ge_{0.25}$ shows an average ZT of 0.9 and an average PF of 52 $\mu W\ cm^{-1}\ K^{-2}$ over the temperature range of 25-450° C., and also a peak ZT of 1.4 at 450° C. and peak PF of 55 $\mu W\ cm^{-1}\ K^{-2}$ at 350° C. Theoretically, $Mg_2Sn_{0.75}Ge_{0.25}$ leg could have an efficiency $\eta$ of 10.5%, and an output power density $\omega$ of 6.6 W $cm^{-2}$ under a temperature gradient of 150° C. $mm^{-1}$ for $T_h=400°$ C. and $T_c=50°$ C. Compared with the reported $Mg_2Si_{1-x}Sn_x$ system, the higher power factor obtained in $Mg_2Sn_{1-x}Ge_x$ is associated with the increased $S^en$ attributable to the band convergence and higher carrier mobility, which in turn are due to the smaller size difference between Sn and Ge than between Sn and Si. Furthermore, coherent nano inclusions were identified in the $Mg_2Sn_{1-x}Ge_x$ materials.

Material Fabrication

Elemental powders, including magnesium (Mg, 99.98%, Alfa Aesar), tin (Sn, 99.8%, Alfa Aesar), and germanium (Ge, 99.999%, Alfa Aesar), were weighed according to the stoichiometric $Mg_2Sn$ and $Mg_2Sn_{0.75}Ge_{0.25}$. Here, antimony (Sb, 99.99%, Alfa Aesar) and slight extra magnesium was used to adjust the carrier concentration. The element mixtures were then subjected to mechanical ball milling for up to 20 hours. The ball-milled powders were then loaded into a graphite die with an inner diameter of 12.7 mm and hot pressed into bulk samples by direct current induced hot pressing at 600-750° C. for 2 minutes. Depending on the embodiment, the hot pressing time, temperature, and pressure (e.g., 80 MPa in some cases), may vary.

Material Characterization

Crystal structure. X-ray diffraction measurements were conducted on two systems: PANalytical multipurpose diffractometer with an X'celerator detector (PANalytical X'Pert Pro) and a Brucker D2 PHASER system. The lattice parameters of $Mg_2Sn_{1-x-y}Ge_xSb_y$, were calculated by the Rietveld refinement method, which was done in Fullprof suite by using a cubic structure (space group: Fm$\overline{3}$m, No. 225) as the starting structure. The microstructures of the samples were studied by a JEOL 6340F scanning electron microscope (SEM) and a JEOL 2010-F transmission electron microscope (SEM). The composition analysis was conducted by energy-dispersive X-ray spectroscopy (EDS) inside the SEM.

Thermoelectric transport properties. The electrical resistivity was measured by a reverse dc-current four-point method, while the Seebeck coefficient was determined by the slope of the voltage difference versus temperature difference curve based on a static temperature difference method. The simultaneous measurement of electrical resistivity and Seebeck coefficient was conducted on a commercial system (ZEM-3, ULVAC). The thermal conductivity was calculated from the relationship $\kappa=DC_pd$, where D, $C_p$, and d are the thermal diffusivity, specific heat, and volumetric density, respectively. The thermal diffusivity was measured by the laser flash method with a commercial system (LFA447, Netzsch). The specific heat capacity was determined by a differential scanning calorimeter (DSC 404 C). The volumetric density was measured by the Archimedes method. The Hall coefficient, $R_H$, was carried out on a commercial system (PPMS, Quantum Design), with a magnetic field up to 6T and an electrical current of 10-20 mA.

Referring now to FIG. 1A, the figure that illustrates patterns of $Mg_2Sn_{1-x}Ge_x$ fabricated according to certain embodiments of the present disclosure. FIG. 1A is an XRD pattern of ball milled powders of $Mg_2Sn_{0.73}Ge_{0.25}Sb_{0.02}$, which matches the standard cubic $Mg_2Sn$ phase (PDF #03-065-2997), and FIG. 1B is an XRD pattern of the hot pressed bulk polycrystalline $Mg_2Sn$ with Rietveld refinement. The inset of FIG. 1A is the schematic figure of cubic $Mg_2X$ (X=Sn and Ge) crystalized in the space group of Fm3m (No. 225).

Selecting and/or controlling the particle size of the starting materials contribute to the fabrication of phase-pure samples. Since both the major starting materials Mg and Sn are very soft, they easily stick on the wall of the stainless steel jar. Luckily, the reacted product $Mg_2Sn$ is brittle, which can be ball milled into nanopowders. Only a cubic phase was observed in the ball milled $Mg_2Sn$ nanopowders, as shown in FIG. 1A, which also demonstrates that a small stress was left in ball milled nano powders. FIG. 1B illustrates that the hot pressed bulk material has the same cubic $Mg_2Sn$ phase as the ball milled powders in FIG. 1A. No oxide impurity was identified, as shown FIG. 1B. In an embodiment, a milled powder comprises particles having diameters less than or equal to 10 micrometers.

Figure 2A:
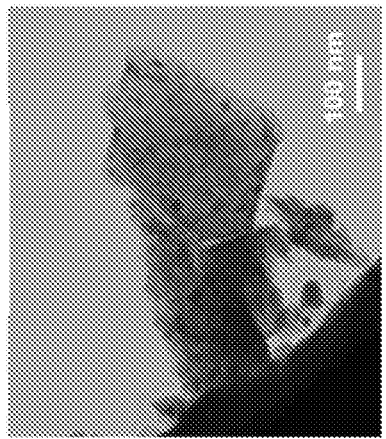
FIGS. 2A-2D are images of the microstructures of $Mg_2Sn_{0.75}Ge_{0.25}$ in an as-fabricated state for samples fabricated according to certain embodiments of the present disclosure.
Figure 2B:
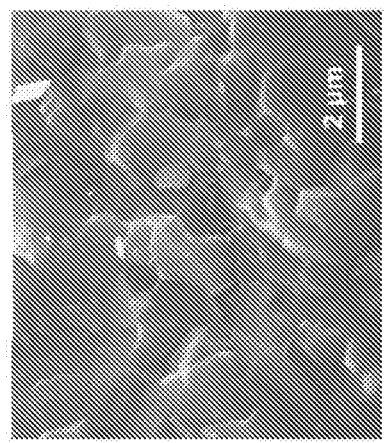
Figure 2C:
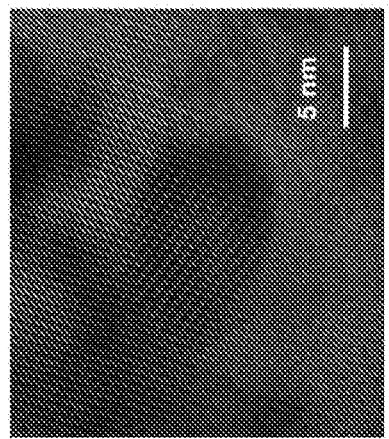
Figure 2D:
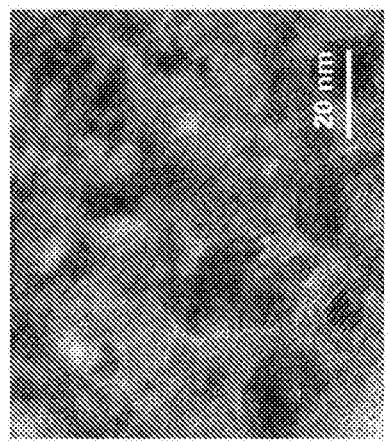

Referring now to FIGS. 2A-2D that illustrate images of the microstructures of the as-fabricated $Mg_2Sn_{0.75}Ge_{0.25}$. The SEM image of the freshly fractured surface, as shown in FIG. 2A, shows the grain size distribution ranges from about 0.5 μm to about 2 μm. Smaller grains of about 300 nm were also identified in the TEM image, as shown in FIG. 2B. Furthermore, some nano-inclusions of 5-10 nm in diameter were observed in the HR-TEM images, as shown in FIG. 2C-D. Such nano inclusions are most likely due to stress caused by the slightly composition fluctuation within the single crystalline grain. These nano-inclusions are the active phonon scattering centers. It is noted that the observed nano-inclusions have coherent boundaries within the matrix, which should have less impact on the transport of the electrons.

Figure 3A:
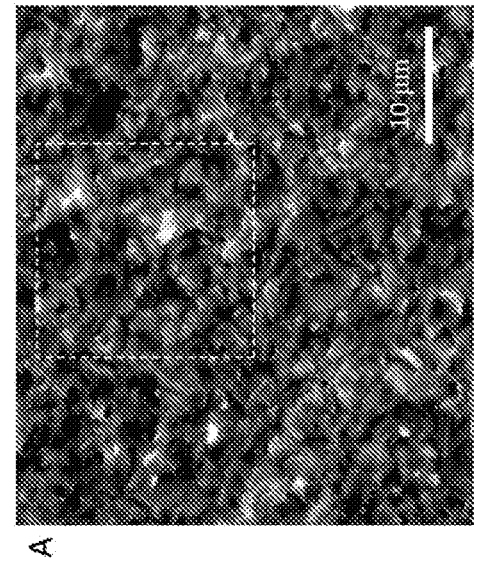
FIGS. 3A and 3B are a scanning electron microscopy (SEM) image and an energy-dispersive X-ray spectroscopy (EDS)-measured composition of $Mg_{2.06}Sn_{0.728}Ge_{0.25}Sb_{0.022}$ fabricated according to certain embodiments of the present disclosure.
Figure 3B:
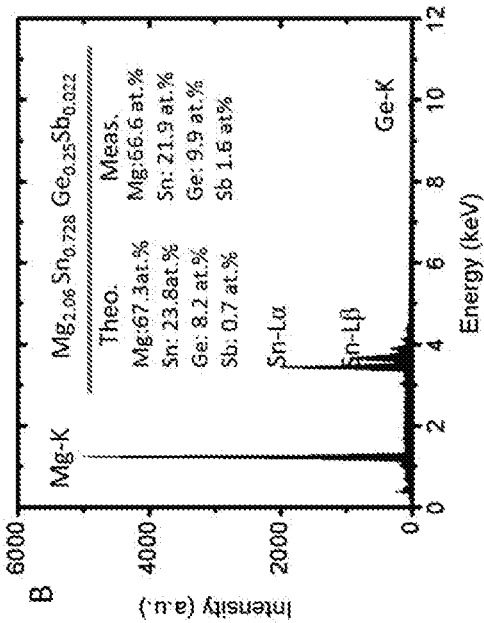

Turning now to FIGS. 3A and 3B, FIG. 3A is an SEM image of $Mg_{2.06}Sn_{0.728}Ge_{0.25}Sb_{0.022}$ and FIG. 3B is an energy-dispersive X-ray spectroscopy (EDS) image taken from the section 302 in the SEM image of FIG. 3A. The EDS results indicate that the composition of the sample was about 66.6 at. % for Mg, about 21.9 at. % for Sn, about 9.9 at. % for Ge, and about 1.6 at. % for Sb, which are substantially similar to that of the nominal composition.

Turning now to FIGS. 4A-4D, the carrier concentrations of $Mg_2Sn$ and $Mg_2Sn_{0.75}Ge_{0.25}$ are $1.8 \times 10^{20}$ cm$^{-3}$ and $3.0 \times 10^{20}$ cm$^{-3}$, respectively, are shown. The net carrier of each Sb atom is estimated to be ~1 carrier/atom, which is independent of Ge content in the $Mg_2Sn_{1-x}Ge_x$ system. The electrical resistivity (FIG. 4A) and Seebeck coefficient (FIG. 4B) increase almost linearly below 300° C., demonstrating degenerate semiconductor behavior. The Fermi energy ($E_F/k_BT$) calculated from the Seebeck coefficient is 0.031-0.049 eV, equal to 1.2-1.9 $k_BT$. Above 300° C., the Seebeck coefficient of $Mg_2Sn$ tends to saturate, which results from the onset of the bipolar effect due to the narrow band gap. However, $Mg_2Sn_{0.75}Ge_{0.25}$ still follows the linear increase above 300° C., which suggests widening of the band gap. This is consistent with the earlier reported result: Ge continuously increases the band gap from 0.26 eV for x=0 to 0.41 eV for x=0.4 in reference material $Mg_2Sn_{1-x}Ge_x$. One of the advantages associated with the alloying effect of Ge is the higher power factor of 45 μW cm$^{-1}$ K$^{-2}$ near room temperature, as shown in FIG. 4C. As used herein, "near" room temperature refers to a temperature range from about 10° C. (283.15K) to about 100° C. (383.15 K). This value is even higher than that of the textured $Bi_2Te_{2.7}Se_{0.3}$ polycrystalline sample (~39 μW cm$^{-1}$ K$^{-2}$). The maximum power factor of $Mg_2Sn_{0.75}Ge_{0.25}$ has reached 55 μW cm$^{-1}$ K$^{-2}$ at 350° C. Due to the weak temperature dependent behavior, the $Mg_2Sn_{0.75}Ge_{0.25}$ sample also has a higher average power factor of ~52 μW cm$^{-1}$ K$^{-2}$ over the temperature range of 25-450° C., which is 13%-16% higher than that of the conventionally employed $Mg_2Sn_{1-x}Si_x$ samples [~46 μW cm$^{-1}$ K$^{-2}$ for $Mg_2Sn_{0.7}Si_{0.3}$, ~45 μW cm$^{-1}$ K$^{-2}$ for $Mg_2Sn_{0.6}Si_{0.4}$]. FIG. 4D shows the power factor of three batches of $Mg_2Sn_{0.75}Ge_{0.25}$ samples.

$Mg_2X$ (X=Si, Ge, Sn) are indirect semiconductors, in which the top of valence band is located at Γ point while the bottom of the conduction band is located at X point. For $Mg_2Sn$, the lowest conduction band is unoccupied Mg(3s) band (identified as $X_H$-band), followed by a hybridized Mg(3s)-Sn(5p) band (identified as $X_L$-band) that is slightly higher than the lowest band with band edge difference of $E_A$=0.16 eV. In the $Mg_2Sn_{1-x}Ge_x$ system, the contribution of the additional band ($X_L$-band) to the total electronic transport significantly increases with the increasing of Ge content. A direct result of the band convergence effect is the increased $S^2n$ from $2.45 \times 10_{14}$ V$^2$ K$^{-2}$ m$^{-3}$ for x=0 to $5.40 \times 10^{14}$ V$^2$ K$^{-2}$ m$^{-3}$ for x=0.25 in $Mg_2Sn_{1-x}Ge_x$. The increased $S^2n$ is confirmed by the increased carrier effective mass from m*=2 $m_0$ for x=0 to m*=3.5 $m_0$ for x=0.25. Here, the carrier effective mass was estimated from the measured Hall carrier concentration and the Seebeck coefficient, $$S = -\frac{k_B}{e}\left(\frac{(r+5/2)F_{r+3/2}(\xi)}{(r+3/2)F_{r+1/2}(\xi)} - \xi\right), \quad [3]$$

$$n_H = \frac{2}{r_H}\left(\frac{2\pi m_e^* k_B T}{h^2}\right)^{3/2} F_{1/2}(\xi), \quad [4]$$

$$r_H = \frac{3}{4}\frac{F_{1/2}(\xi)F_{-1/2}(\xi)}{F_0^2(\xi)}. \quad [5]$$

where $F_n(\xi)$ is the Fermi integration, $\xi$ is the Fermi energy, and r is the scattering factor in the relaxation time approximation. The increased carrier effective mass m* could be direct evidence for the increased contribution of the additional $X_L$-band to the main $X_H$-band owing to the shrinkage of the band edge difference $E_A$.

However, only increased $S^2n$ cannot guarantee the improvement of the power factor if carrier mobility is decreased too much due to the addition of Ge. A decrease in carrier mobility from 86 cm$^2$ V$^{-1}$ s$^{-1}$ for x=0 to 46 cm$^2$ V$^{-1}$ s$^{-1}$ for x=0.25 was observed, which is considered as the result of the alloying scattering. However, the ratio of decreasing μ is less than that of increasing $S^2n$ in $Mg_2Sn_{1-x}Ge_x$ system, which therefore leads to a raised PF. The alloying scattering to charge carriers was mainly resulted from the lattice deformation due to alloying atoms. Physically, the effect of lattice deformation on the carrier mobility is quantified through the term of deformed potential energy fluctuation $U_d$ on the basis of the relaxation time approximation.

$$\mu_{al} = \frac{eh^4}{9\sqrt{2}\,\pi^5 x(1-x)(\kappa_B T)^{1/2}} \frac{N_0}{U_d^2(m_b^*)^{5/2}} \frac{F_0(\xi)}{F_{1/2}(\xi)}, \quad [6]$$

where $N_0$ is the atomic number in unit volume; x the fractional concentration of the alloy atom at a given lattice site; and $m_b^*$ the average single valley density of states effective mass, related to the effective mass through $m^* = N_v^{2/3} m_b^*$. Chemically, the lattice deformation, due to the alloying atom or impurity atom, is connected to the change of the chemical bonding strength and length. Here, the potential energy fluctuation $U_d$ is estimated by first extracting the $\mu_{al}$ from the measured carrier mobility $\mu$. The acoustic phonon scattering needs to be taken into account in addition to the alloying disorder scattering for electrons through the Matthiessen's rule as following, $$\frac{1}{\mu} = \frac{1}{\mu_{ph}} + \frac{1}{\mu_{al}}. \quad [7]$$

$\mu_{ph}$ is the carrier mobility with only acoustic phonon scattering. Here, the measured $\mu$ of Mg$_2$Sn (~86 cm V$^{-1}$ s$^{-1}$) was used as an approximation for the $\mu_{ph}$ in Sn-enriched Mg$_2$Sn$_{1-x}$Ge$_x$. By applying Eq. 6 and 7 to the carrier mobility of Mg$_2$Sn$_{1-x}$Ge$_x$ (x=0.01, 0.03, 0.05, 0.1, 0.15, 0.2, 0.25), the potential energy fluctuation $U_d$ was determined to be about 0.07-0.2 eV.

Figures 5A, 5B, 5C, 5D:
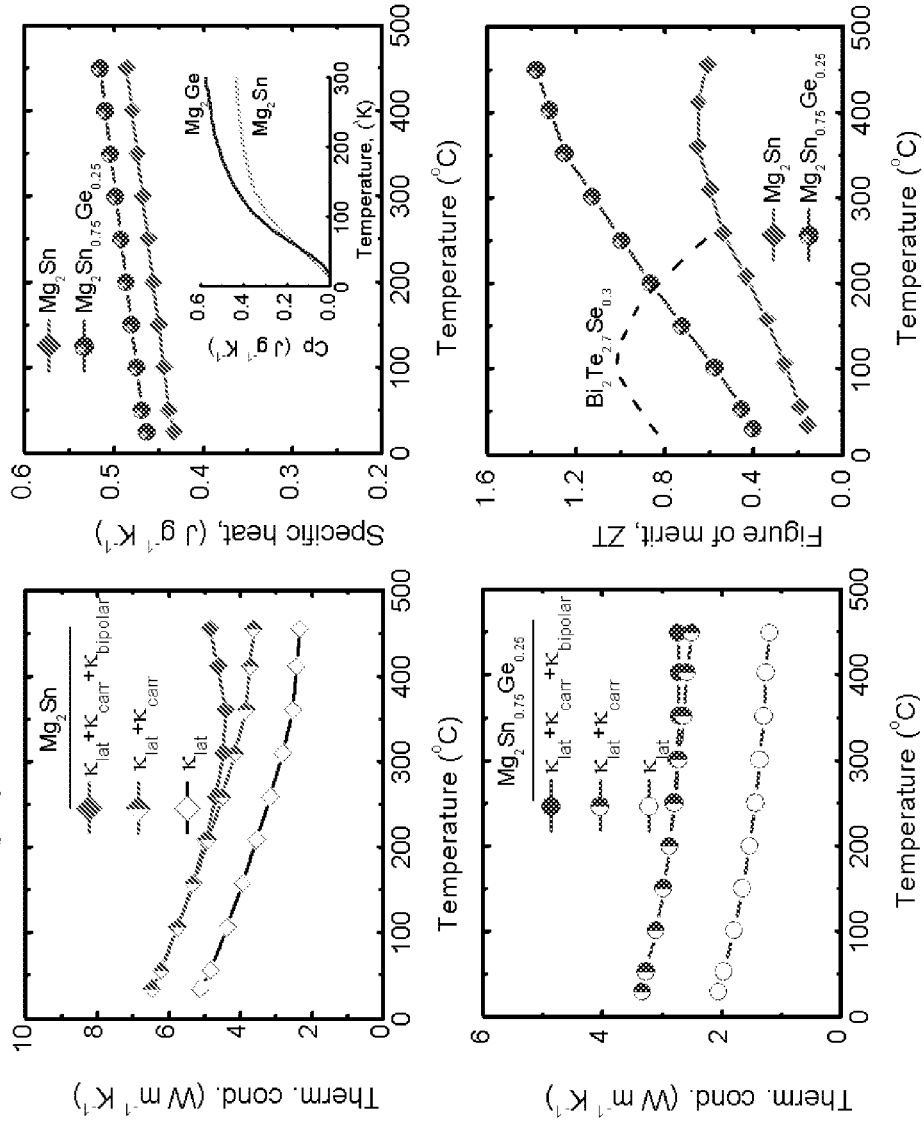
FIGS. 5A-5D are graphs of temperature dependent thermoelectric properties of samples of $Mg_2Sn$ and $Mg_2Sn_{0.75}Ge_{0.25}$ fabricated according to certain embodiments of the present disclosure.

Thermal conductivity of as-fabricated Mg$_2$Sn (FIG. 5A) and Mg$_2$Sn$_{0.75}$Ge$_{0.25}$ (FIG. 5B) were calculated from the measured density, thermal diffusivity, and specific heat (FIG. 5C), and is shown in FIGS. 5A-D. The measured specific heat is shown in FIG. 5C with the reference data for comparison. At 450° C., the specific heat of both samples is about 8% higher than the Dulong-Petit value. The lattice thermal conductivity (FIGS. 5A and 5B) was calculated by extracting both the contribution of charge carriers and bipolar effect, $$\kappa = \kappa_{lat} + \kappa_{carr} + \kappa_{bipolar}, \quad [8]$$

$$\kappa_{carr} = L\sigma T, \quad [9]$$

$$\kappa_{bipolar} = \frac{\sigma_e \sigma_h}{\sigma_e + \sigma_h}(S_e - S_h)^2 T. \quad [10]$$

Here, an equivalent two band model (one conduction band and one valence band) was used to fit the temperature dependent electrical conductivity and Seebeck coefficient, and then extract the band structure parameters for $\sigma_e$, $\sigma_h$, $S_e$, and $S_h$, and finally the $K_{bipolar}$. A significant reduction in lattice thermal conductivity from 5.13 W m$^{-1}$ K$^{-1}$ (Mg$_2$Sn) to 2.27 W m$^{-1}$ K$^{-1}$ (Mg$_2$Sn$_{0.75}$Ge$_{0.25}$) at 25° C. was seen due to alloying scattering to phonons. A combination of the increased power factor and the decreased thermal conductivity are shown in FIG. 5D, the sample Mg$_2$Sn$_{0.75}$Ge$_{0.25}$ has a ZT value of at least 1.0 from about 200° C. to about 475° C., and a peak ZT value of 1.4 at 450° C., which is 130% higher than that of Mg$_2$Sn. The ZT value of the best n-type Bi$_2$Te$_{2.7}$Se$_{0.3}$ is presented in FIG. 4D for comparison. Clearly, Mg$_2$Sn$_{0.75}$Ge$_{0.25}$ has higher ZT than Bi$_2$Te$_{2.7}$Se$_{0.3}$ above 200° C. Therefore, a segmented leg comprising both Bi$_2$Te$_{2.7}$Se$_{0.3}$ and Mg$_2$Sn$_{0.75}$Ge$_{0.25}$ may result in a higher efficiency and output power density in the temperature range of 25-450° C.

In order to evaluate the thermoelectric performance of Mg$_2$Sn$_{0.75}$Ge$_{0.25}$ in terms of both the conversion efficiency and output power, compare Mg$_2$Sn$_{0.75}$Ge$_{0.25}$ with some of the reported best Mg$_2$Sn$_{1-x}$Si$_x$ samples in FIGS. 6A-6F.

Figure 6C:
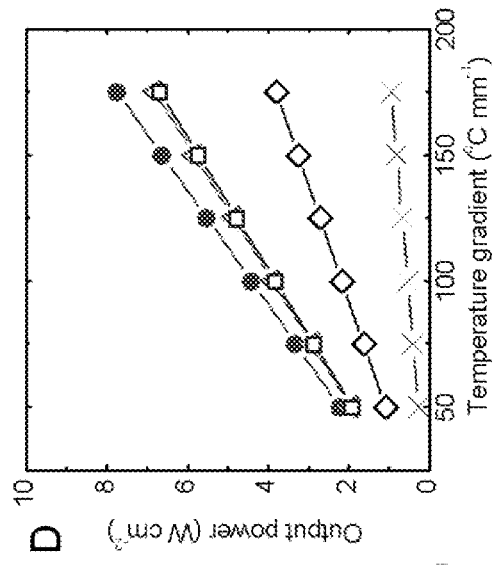
Figure 6D:
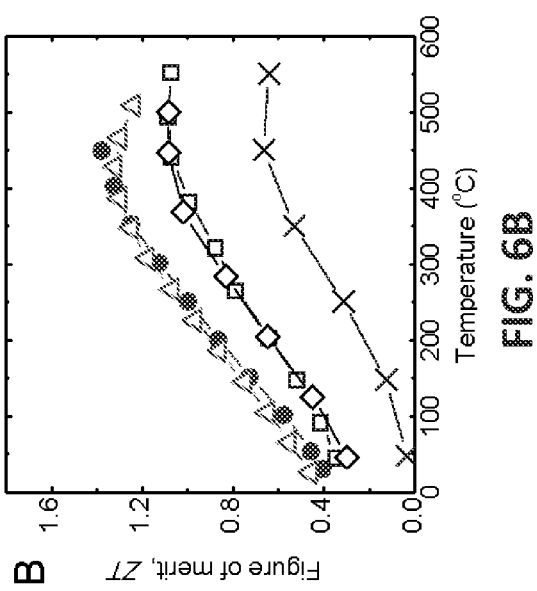
Figure 6A:
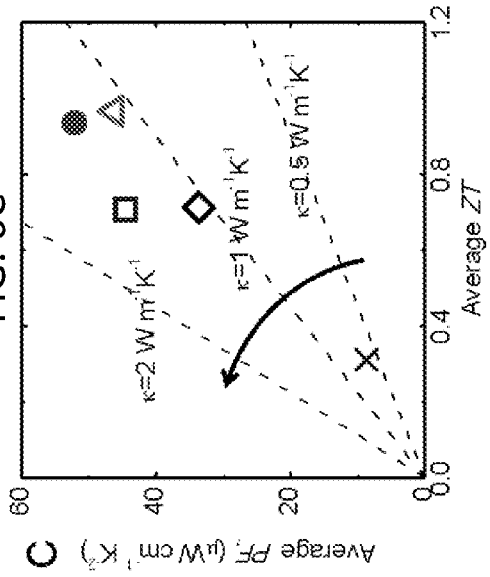
Figure 6B:
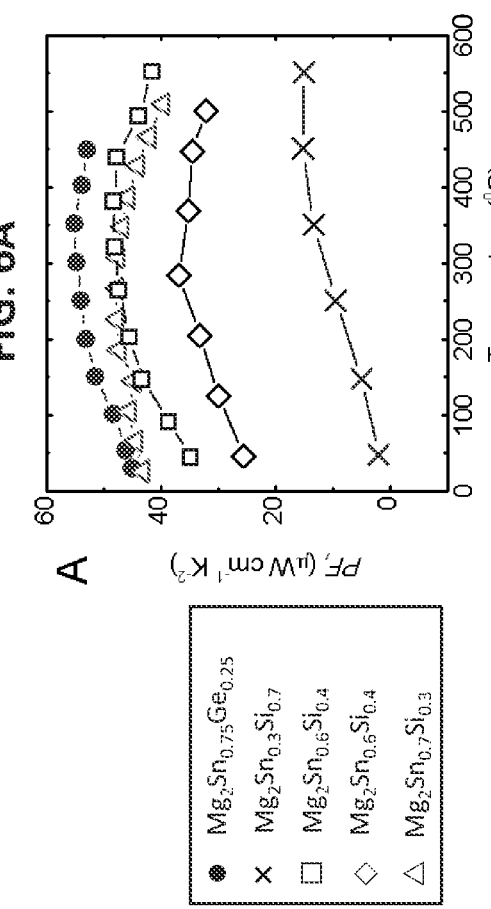

FIGS. 6A-6F illustrate comparisons between Mg$_2$Sn$_{0.75}$Ge$_{0.25}$ with the state-of-the-art Mg$_2$Sn$_{1-x}$Si$_x$, including the temperature dependent properties of the power factor (PF) (FIG. 6A), the ZT (FIG. 6B), the average PF versus average ZT (FIG. 6C), and the ZT (FIG. 6B). In addition, the leg output power density is shown as function of temperature gradient, (FIG. 6D), the leg output power density is shown as a function of source heat flux (FIG. 6E), and the output power versus efficiency is also shown (FIG. 6F). The samples in FIGS. 6A-6F represented the filled circles (●) are Mg$_2$Sn$_{0.75}$Ge$_{0.25}$ were fabricated according to embodiments of the present disclosure, and the crosses (x) are reference material Mg$_2$Sn$_{0.3}$Si$_{0.7}$. Samples made from melting route: unfilled squares (■) are reference material Mg$_2$Sn$_{0.6}$Si$_{0.4}$, unfilled diamonds (◇) are reference material Mg$_2$Sn$_{0.6}$Si$_{0.4}$, both ■ and ◇ reference the same composition taken from different previous works, and the unfilled triangles (△) are reference material Mg$_2$Sn$_{0.7}$Si$_{0.3}$. The slope of the dashed line in FIG. 6C is the $\kappa/T_{avg}$ with $\kappa$=0.5, 1 and 2 W m$^{-1}$ K$^{-1}$ and $T_{avg}$=225° C. The slope of the dashed line in FIG. 6E is the efficiency $\eta$ of 4%, 6%, 8%, 10% and 12%. The dashed line in figure FIG. 6F is heat flux at hot side $Q_{in}$ of 40, 60, and 80 W cm$^{-2}$.

First, the power factor (FIG. 6A) of Mg$_2$Sn$_{0.75}$Ge$_{0.25}$ is almost three times higher than that of Mg$_2$Si$_{0.7}$Sn$_{0.3}$ made by ball milling and hot pressing. However, as shown in FIG. 6B, most of the Mg$_2$Sn$_{1-x}$Si$_x$ samples synthesized by melting metallurgy showed ZT higher than 1, e.g., Mg$_2$Sn$_{0.7}$Si$_{0.3}$ showed a ZT of 1.3 near 430° C., but was almost 15% lower in power factor. To exemplify the role of PF in the performance of both efficiency and output power, the temperature dependent thermoelectric transport properties was taken into account. The numerical solution of temperature distribution T(x) in the energy balance equation of one-dimensional heat flow is $$\frac{d}{dx}\left(\kappa(x)\frac{dT(x)}{dx}\right) + J^2\rho(x) - JT(x)\frac{dS(x)}{dx} - \varepsilon\sigma\frac{w}{A}(T^4(x) - T_\infty^4) = 0, \quad [11]$$

where $\varepsilon$, $\sigma$, w, J, and $T_\infty$ are the emissivity, the Stephan-Boltzmann constant, perimeter of a leg, current density, and the ambient temperature, respectively. The parts on the left hand side represent the conduction heat, Joule heat, Thomson heat, and radiation heat loss, respectively. Since the temperature is a function of position, x, $T_h$ at x=0 and $T_c$ at x=L (length of the leg) is assigned so that the temperature-dependent thermoelectric properties are also a function of x. In order to solve this differential equation, a finite difference model is developed, where a leg is divided into n nodes, and a central difference method is applied to determine the relationship of adjacent nodes.

Here, a conservative temperature boundary of $T_h$=400° C. and $T_c$=50° C. was used considering the potentially thermal instability of Mg$_2$Sn$_{0.75}$Ge$_{0.25}$ above 400° C. For simplicity, no radiation heat loss was considered here. FIG. 6D shows leg output power under different temperature gradient, i.e., $(T_h-T_c)$/L. Under the same temperature gradient of 150° C./mm Mg$_2$Sn$_{0.75}$Ge$_{0.25}$ leg could have an output power density of ~6.6 W cm$^{-2}$ with a leg efficiency of 10.5%, which is better than any of the reported state-of-the-art Mg$_2$Sn$_{1-x}$Si$_x$ materials, as shown in FIG. 6E. Based on the dual index of efficiency and output power, $Mg_2Sn_{0.75}Ge_{0.25}$ seems to be the best material for power generation in the temperature range of $T_h=400°$ C. and $T_c=50°$ C. It may be arguable that the same output power could also be achieved by using larger temperature gradient for samples with smaller PF and smaller κ. However, the main issue is that a larger temperature gradient will result in a larger thermal stress at the contact interface between thermoelectric legs and electrode, which will significantly shorten the lifetime of the device. By comparing FIGS. 6C and 6F, it is clearly shown that the material with higher power factor is preferred to achieve higher output power for the same ZTs.

In an embodiment, FIG. 6C of "average ZT versus average PF" could be new criteria for exploring new thermoelectric materials, or for boosting the thermoelectric performance of the known materials. Furthermore, for real applications, the price of the raw materials needs to be taken into consideration. Presently, the estimated price of $Mg_2Sn_{0.75}Ge_{0.25}$ raw material is ~$190/kg according to the U.S. Geological Survey Data Series, 2013. It is comparable to the conventional n-type $Bi_2Te_{2.7}Se_{0.3}$ ($170/kg) and p-type $Bi_{0.4}Sb_{1.6}Te$ ($209/kg) but cheaper than $Hf_{0.75}Zr_{0.25}Sn_{0.99}Sb_{0.01}$ ($235/kg) and $In_4Se_3$ ($580/kg). The cost of $Mg_2Sn_{0.75}Ge_{0.25}$ can be further reduced from $190/kg to $150/kg without reduction in ZT by partially replacing the 20% germanium with silicon.

Turning to FIGS. 7A-7F, all the samples of the $Mg_{2+\delta}Sn_{1-x-y}Ge_xSb_y$ show an almost linearly increased electrical resistivity (FIG. 7A) and a Seebeck coefficient below 225μV/K below 300° C., demonstrating a behavior of degenerate semiconductor, wherein δ is 0 to 0.1, and y is 0 to 0.5. The Fermi energy ($E_F/k_BT$) calculated from the Seebeck coefficient is 0.031-0.049 eV, equal to 1.2-1.9 $k_BT$. Above 300° C., the Seebeck coefficient (FIG. 7B) for the samples of $Mg_{2+\delta}Sn_{1-x-y}Ge_xSb_y$ with x=0 and 0.05 shows saturated character while for the ones with x=0.25 and x=0.30 still follows the linear temperature dependence. Among the samples, the $Mg_{2+\delta}Sn_{0.73}Ge_{0.25}Sb_{0.02}$ shows the highest power factor (FIG. 7C), i.e. 43 μW $m^{-1}K^{-2}$ near room temperature and over 50 μW $m^{-1}K^{-2}$ in a wide temperature range. Here, Sb was chosen as the donor to investigate the effect of Ge on the thermoelectric transport properties of the $Mg_{2+\delta}Sn_{1-x-y}Ge_xSb_y$ alloy. FIG. 8 shows the almost linear relationship between the carrier concentration and the Sb content in the $Mg_{2+\delta}Sn_{1-x-y}Ge_xSb_y$, which indicates a ~1 carr./Sb. One of the desirable features is the free charge transfer from Sb atom is independent of the Ge content in a investigated composition range, i.e., x=0-0.25.

Figure 7B:
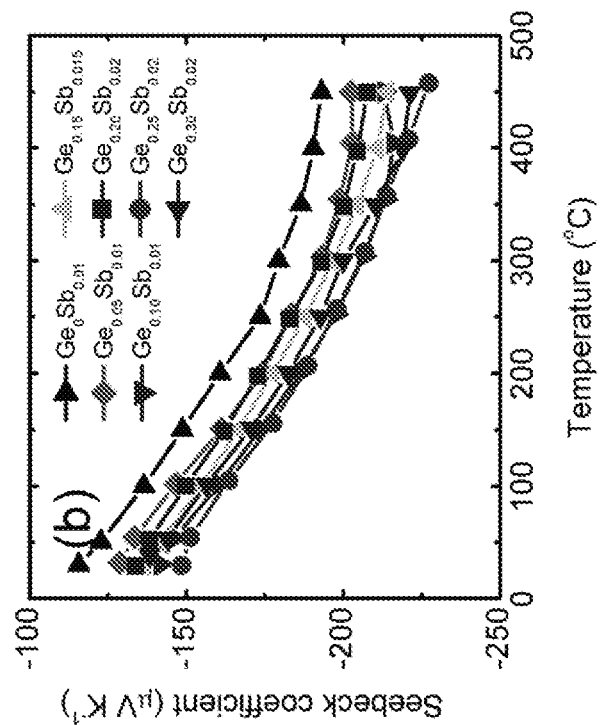
Figure 7A:
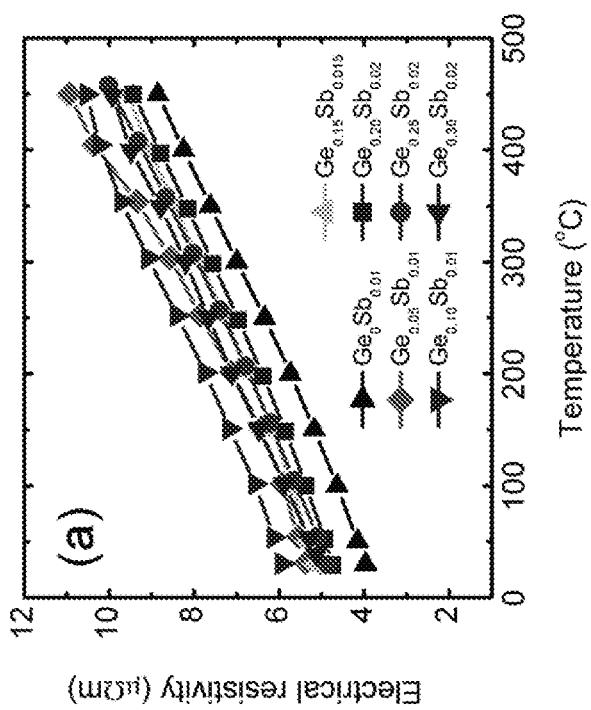
Figure 7D:
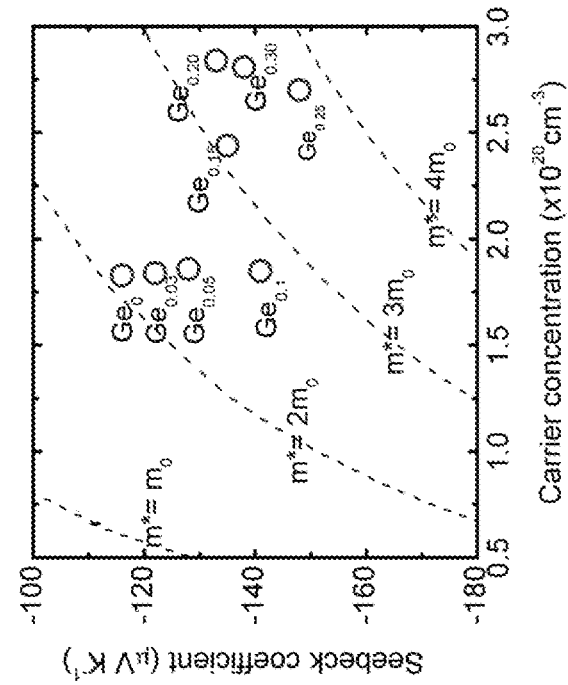
Figure 7C:
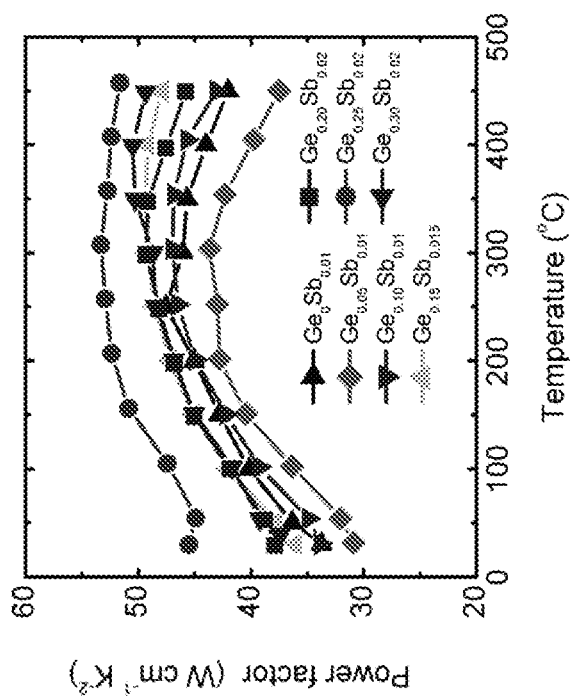
Figure 8:
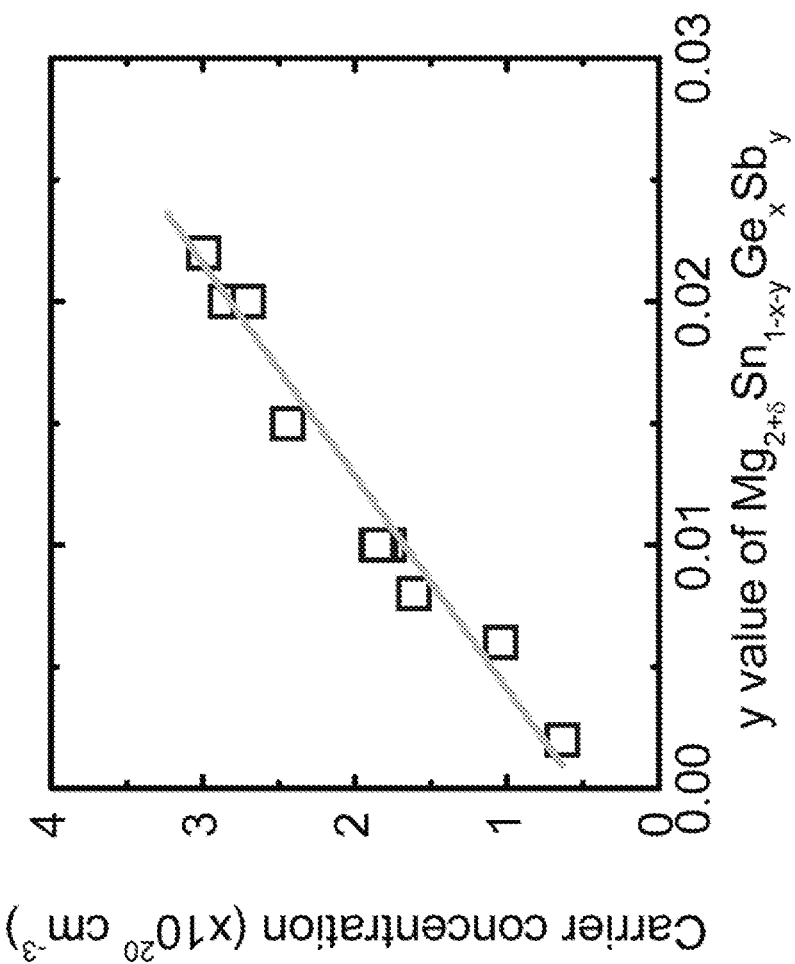
FIG. 8 shows a graph of the relationship between the carrier concentration and the Sb content in the $Mg_{2+\delta}Sn_{1-x-y}Ge_xSb_y$ fabricated according to embodiments of the present disclosure.

FIG. 7D is a graph of the Seebeck coefficient versus carrier concentration near room temperature for the $Mg_{2+\delta}Sn_{1-x-y}Ge_xSb_y$ samples fabricated according to certain embodiments of the present disclosure. At a Ge content of x≤0.1, the samples of $Mg_{2+\delta}Sn_{1-x-y}Ge_xSb_y$ with similar carrier concentration from the same nominal Sb content of y=0.01 show increasing Seebeck coefficient from −116 μV/K for x=0 to −141 μV/K for x=0.1, which suggests increased effective carrier mass. At a Ge content within 0.1≤x≤0.2, the samples of $Mg_{2+\delta}Sn_{1-x-y}Ge_xSb_y$ have an increased carrier concentration from $1.68×10^{20}$ $cm^{-3}$ for x=0.1 to $2.60×10^{20}$ $cm^{-3}$ for x=0.2 while only a gentle change in the Seebeck coefficient, which also demonstrates an increased effective carrier mass. At a Ge content of x≥0.2, the samples of $Mg_{2+\delta}Sn_{1-x-y}Ge_xSb_y$, with similar carrier concentration from the same Sb content of y=0.02, exhibit a maximum Seebeck and also a highest power factor at x=0.25. The variation of Seebeck coefficient with carrier concentration (FIG. 7D) in $Mg_{2+\delta}Sn_{1-x-y}Ge_xSb_y$ indicates that the band structure significantly changes with the content of Ge, which will be discussed below. Due to the decreased thermal conductivity (FIG. 7E), the thermoelectric ZT (FIG. 7F) value is significantly boosted from 0.6 for x=0 to around 1.4 for x=0.25.

Figure 9D:
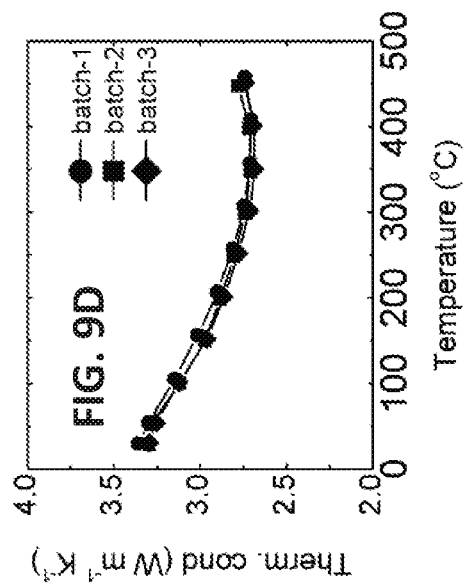
Figure 9C:
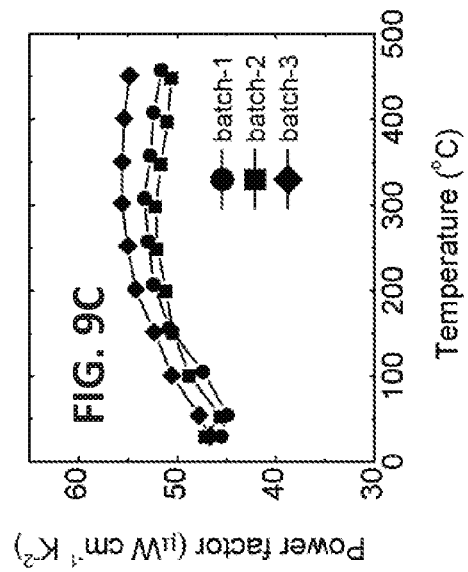
Figure 9E:
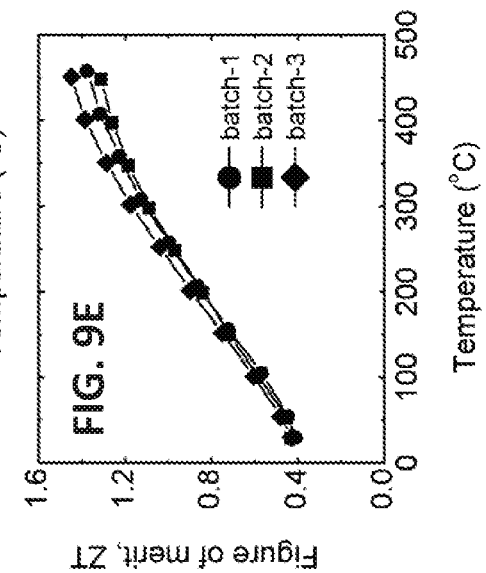
Figure 9G:
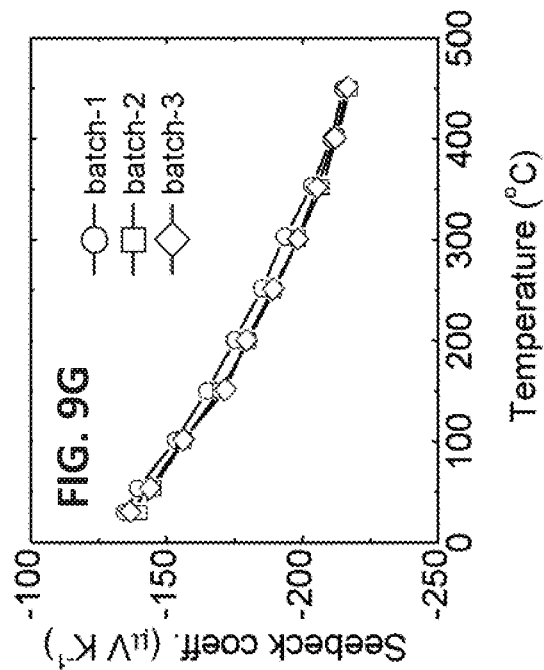
Figure 9F:
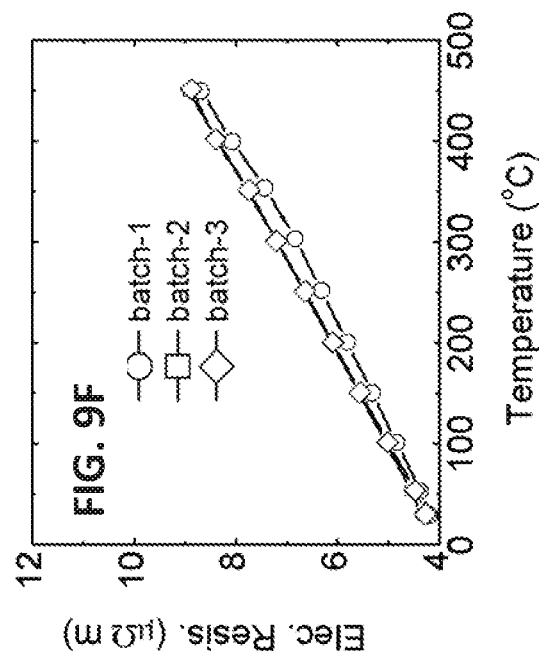

FIGS. 9A-9J show the three batches sample for the $Mg_{2+\delta}Sn_{0.75-y}Ge_{0.25}Sb_y$ at two different carrier concentration, i.e. $2.7×10^{20}$ $cm^{-3}$ (FIGS. 9A-9E) and $3.0×10^{20}$ $cm^{-3}$ (FIGS. 9F-9J), respectively. The room temperature Seebeck coefficient is around −147 μV $K^{-1}$ for the serial sample with carrier concentration of $2.7×10^{20}$ $cm^{-3}$ (FIG. 9B), while around −137 μV $K^{-1}$ for the serial sample with carrier concentration of $3.0×10^{20}$ $cm^{-3}$ (FIG. 9G). A good (usable for applications and manufacturing/manufacturability) reproducibility was achieved in the serial samples with both concentrations ($2.7×10^{20}$ $cm^{-3}$ and $3.0×10^{20}$ $cm^{-3}$). The coefficients of variation for the scattering data of thermoelectric transport properties from batch to batch are less than 5%. The average ZT for both serial samples, where FIG. 9E illustrates the $2.7×10^{20}$ $cm^{-3}$ sample and where FIG. 9J illustrates the $3.0×10^{20}$ $cm^{-3}$ sample is quite close to the 1.4 at 450° C. The electrical resistivity of the $2.7×10^{20}$ $cm^{-3}$ sample is illustrated in FIG. 9A, and that of the $3.0×10^{20}$ $cm^{-3}$ sample is illustrated in FIG. 9F. The power factor of the $2.7×10^{20}$ $cm^{-3}$ sample is illustrated in FIG. 9C, and that of the $3.0×10^{20}$ $cm^{-3}$ sample is illustrated in FIG. 9H. The thermal conductivity of the $2.7×10^{20}$ $cm^{-3}$ sample is illustrated in FIG. 9D, and that of the $3.0×10^{20}$ $cm^{-3}$ sample is illustrated in FIG. 9I.

Turning to FIGS. 10A-10D, the "Ref." sample comprises $Mg_{2.06}Sn_{0.728}Sb_{0.022}Ge_{0.25}$ hot pressed at 750° C. Sample 1 comprises $Mg_{2.06}Sn_{0.728}Sb_{0.022}Ge_{0.25}$ hot pressed at 700° C.; Sample-2 comprises $Mg_2Sn_{0.728}Sb_{0.022}Ge_{0.25}$ hot pressed at 750° C.; and Sample-3 comprises $Mg_2Sn_{0.728}Sb_{0.022}Ge_{0.20}Si_{0.05}$ hot pressed at 750° C. In an embodiment, one advantage of materials fabricated according to the composition $Mg_{2+\delta}Sn_{0.75-y}Ge_{0.25}Sb_y$ is the high power factor (FIG. 10B), which is desirable for thermoelectric power generation applications. Among the various factors, the hot pressing temperature and extra Mg are two sensitive factors to obtain the high power factor in materials of $Mg_{2+\delta}Sn_{0.75-y}Ge_{0.25}Sb_y$. Around an 8% decrease in the power factor (FIG. 10B) was observed while no notable decrease in the density (<1%) when the hot pressing temperature of a composition of $Mg_{2.06}Sn_{0.728}Ge_{0.25}Sb_{0.022}$ decreased from 750° C. to 700° C. The grain boundary could play an important role to the transport of the electrons. The Seebeck Coefficient (FIG. 10A) decreases almost linearly. The as-fabricated material ("Ref") of $Mg_{2.06}Sn_{0.728}Ge_{0.25}Sb_{0.022}$ hot pressed at 750° C. has quite large grains of 0.5-2 μm, which is much larger than conventional thermoelectric materials made by similar technology, such as SiGe and half-Heusler. The extra Mg is factor found in the composition of $Mg_{2.06}Sn_{0.728}Ge_{0.25}Sb_{0.022}$. If no extra Mg used, the power factor (FIG. 10B) of the $Mg_2Sn_{0.728}Ge_{0.25}Sb_{0.022}$ is around 10% lower than the reference composition of $Mg_{2.06}Sn_{0.728}Ge_{0.25}Sb_{0.022}$. Similar conclusion was also draw from the comparison between $Mg_{2.04}Sn_{0.99}Sb_{0.01}$ and $Mg_2Sn_{0.99}Sb_{0.01}$ as shown in FIGS. 11A-11F.

Figures 10A, 10B:
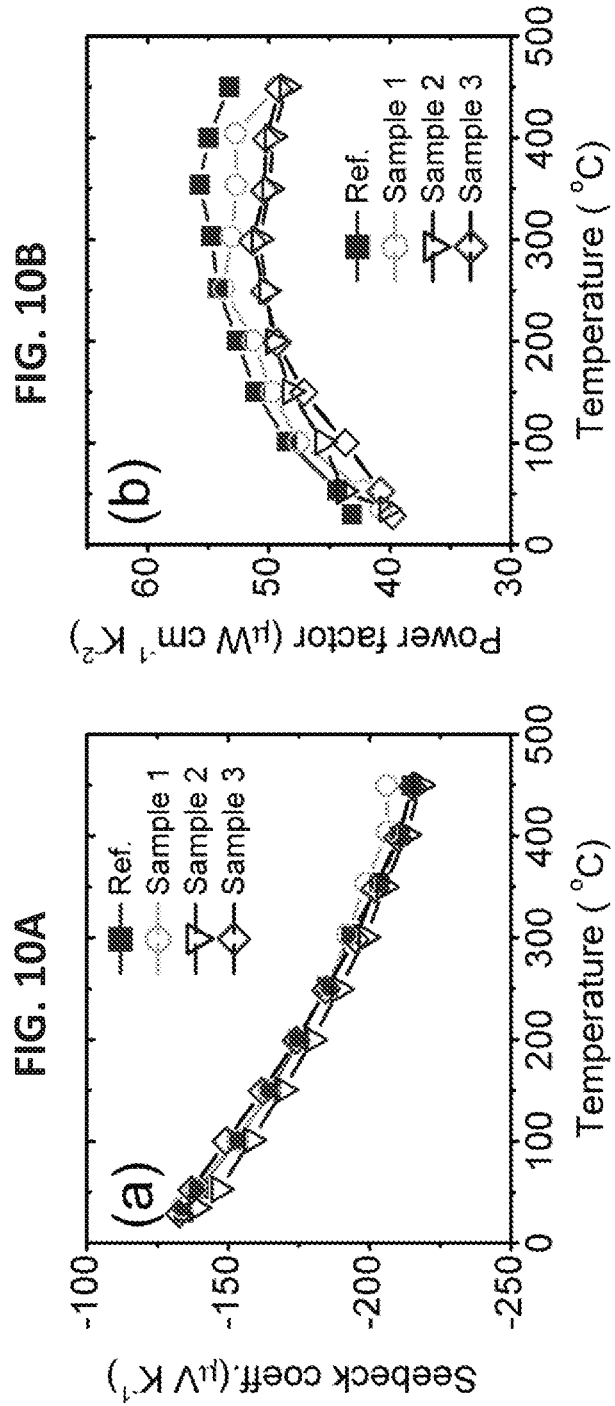

Turning to FIGS. 17A-17F, the small mass difference between Sn and Ge could be another factor the higher power factor (FIG. 17C) of the $Mg_2Sn_{0.685}Ge_{0.25}Si_{0.005}Sb_{0.0015}$ as compared with conventional $Mg_2Sn_{1-x}Si_x$. In order to confirm the effect of Si, 5 at. % Si was used to substitute Ge of $Mg_{2.06}Sn_{0.728}Ge_{0.25}Sb_{0.022}$. The electrical resistivity in FIG. A is illustrated to be higher for the new material Mg$_{2.06}$Sn$_{0.728}$Sb$_{0.022}$Ge$_{0.2}$Si$_{0.05}$ (FIG. 10C) shows lower thermal conductivity (FIG. 17D), but a lower power factor (FIG. 10B compared to FIG. 17C), and an even similar ZT (FIG. 10D compared to FIG. 17F) of 1.4 at 450° C. as compared with Mg$_{2.06}$Sn$_{0.728}$Ge$_{0.25}$Sb$_{0.022}$ (FIGS. 10A-10D). The lattice thermal conductivity in FIG. 17E did not show a significant difference with temperature decrease for either sample.

Figure 12A:
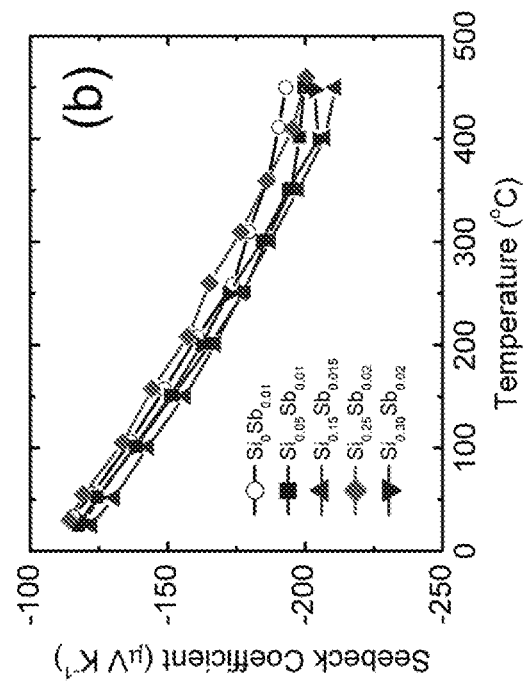
FIGS. 12A-12E are graphs of temperature-dependent thermoelectric properties of $Mg_{2+\delta}Sn_{1-x-y-z}Ge_xSi_ySb_z$ with varying amounts of Si and Sb content, fabricated according to certain embodiments of the present disclosure.
Figure 12B:
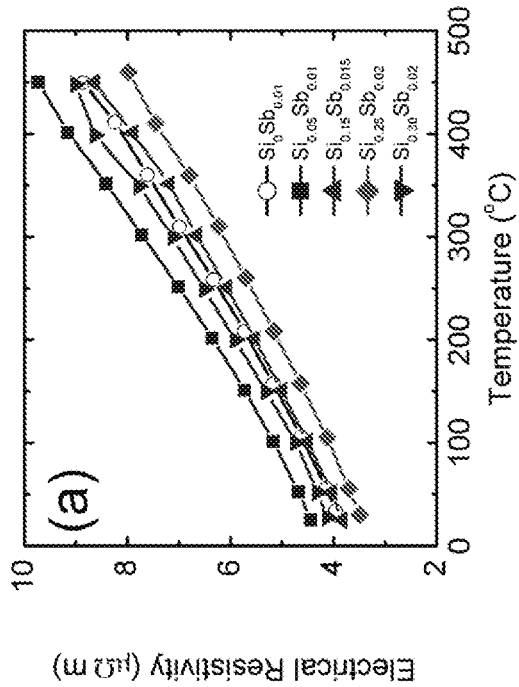

Turning to FIGS. 12A-12E, a plurality of temperature dependent thermoelectric properties of Mg$_{2+\delta}$Sn$_{1-x-y-z}$Ge$_x$Si$_y$Sb$_z$ are illustrated, each sample has varying amounts of Si and Sb where $\delta$=0.04; x=0. In these examples, y is from about 0 to about 0.30, and z is from 0.01 to about 0.02. FIG. 12A illustrates that the electrical resistivity of the samples increases with temperature and increasing concentrations of Si and Sb, and FIG. 12B illustrates that values for the Seebeck coefficient which trend correspondingly downward as the electrical resistivity increases, but the sample with the lowest content of Si and Sb had the highest Seebeck coefficient above about 400° C. In some embodiments, $\delta$ may be from about 0 to about 0.1, y may be from about 0 to about 0.5, and z may be from about 0.01 to about 0.05.

Figure 12D:
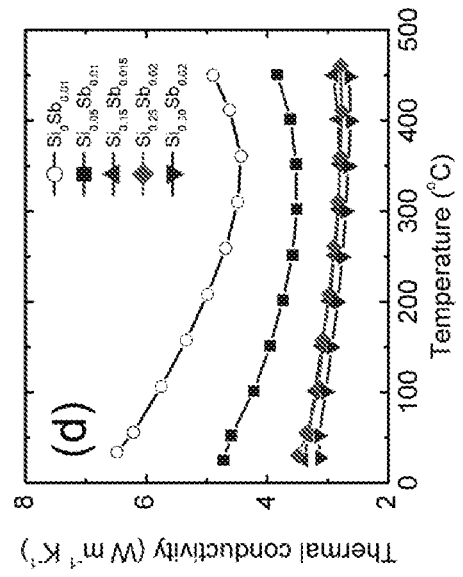
Figure 12C:
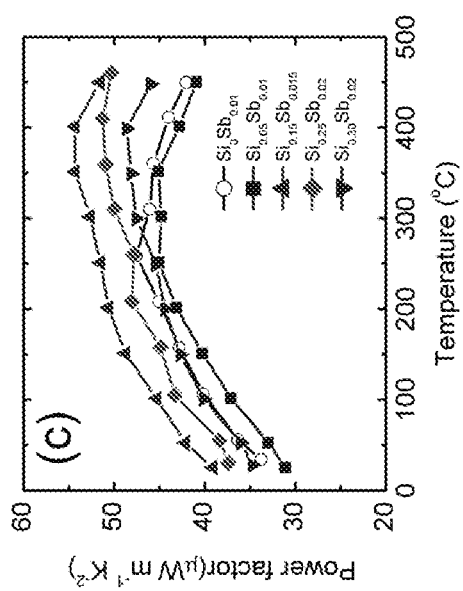
Figure 12E:
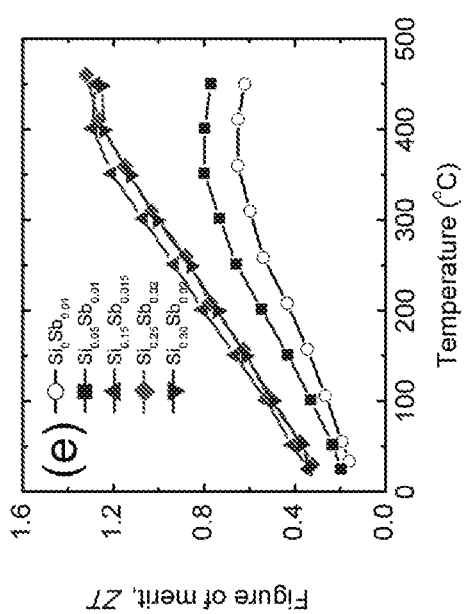

FIG. 12C illustrates the power factor, which seemed to peak for all sample around 400° C., with the Si$_{0.15}$Sb$_{0.015}$ sample exhibiting the highest power factor and the Si$_{0.05}$Sb$_{0.01}$ sample exhibiting comparatively the lowest power factor across the tested range. FIG. 12D illustrates the thermal conductivity, which decreases with increasing temperature for all samples until about 325° C. and then increases. The thermal conductivities decreased with increasing Si and Sb content, the samples comprising contents of Si$_{0.15}$Sb$_{0.015}$, Si$_{0.25}$Sb$_{0.02}$, and Si$_{0.30}$Sb$_{0.02}$ exhibiting comparable values across most of the temperature range. The figure of merit (ZT) is illustrated in FIG. 12E, which shows a ZT of above 1.0 above about 250° C. (from about 250° C. to about 475° C.) for the samples comprising contents of Si$_{0.15}$Sb$_{0.015}$, Si$_{0.25}$Sb$_{0.02}$, and Si$_{0.30}$Sb$_{0.02}$, and a ZT above 1.2 for those same samples above about 350° C.

Figures 11A, 11B, 11C, 11D:
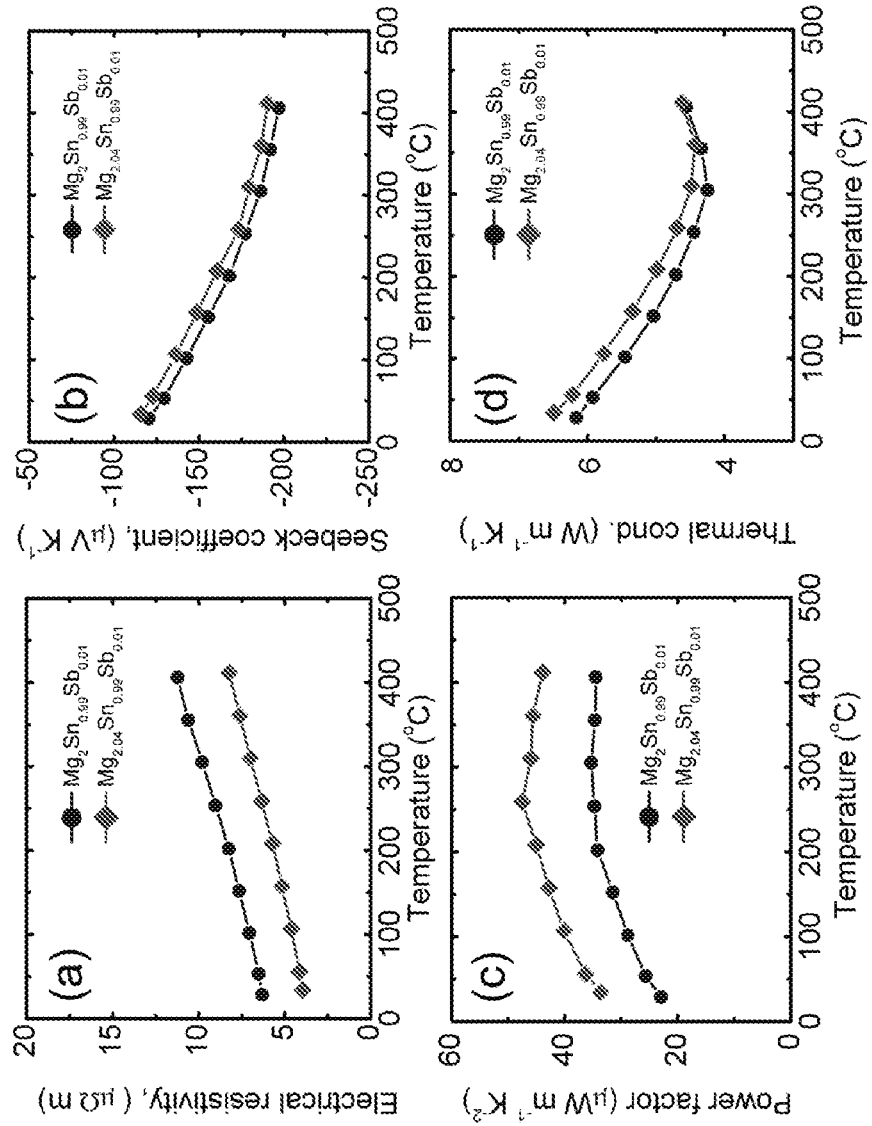
FIGS. 11A-11F are graphs illustrating the temperature-dependent thermoelectric properties for samples of thermoelectric materials fabricated according to embodiments of the present disclosure.
Figure 11E:
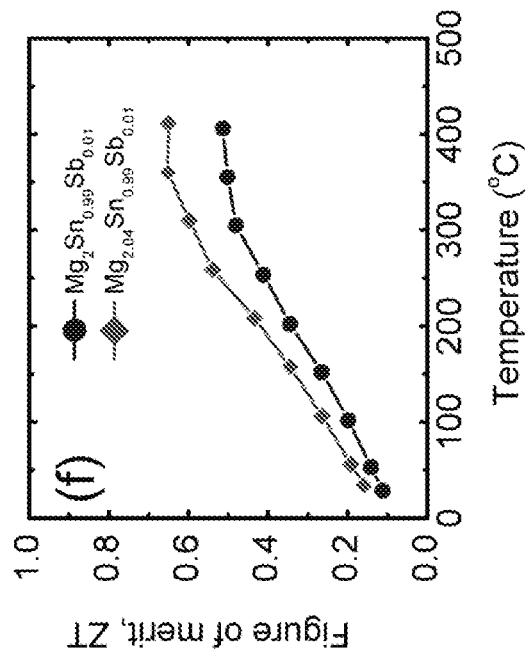
Figure 11F:
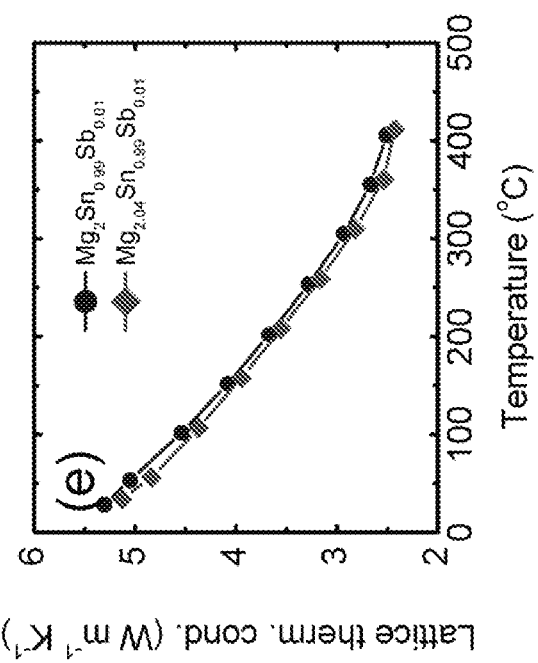
Figures 13A, 13B:
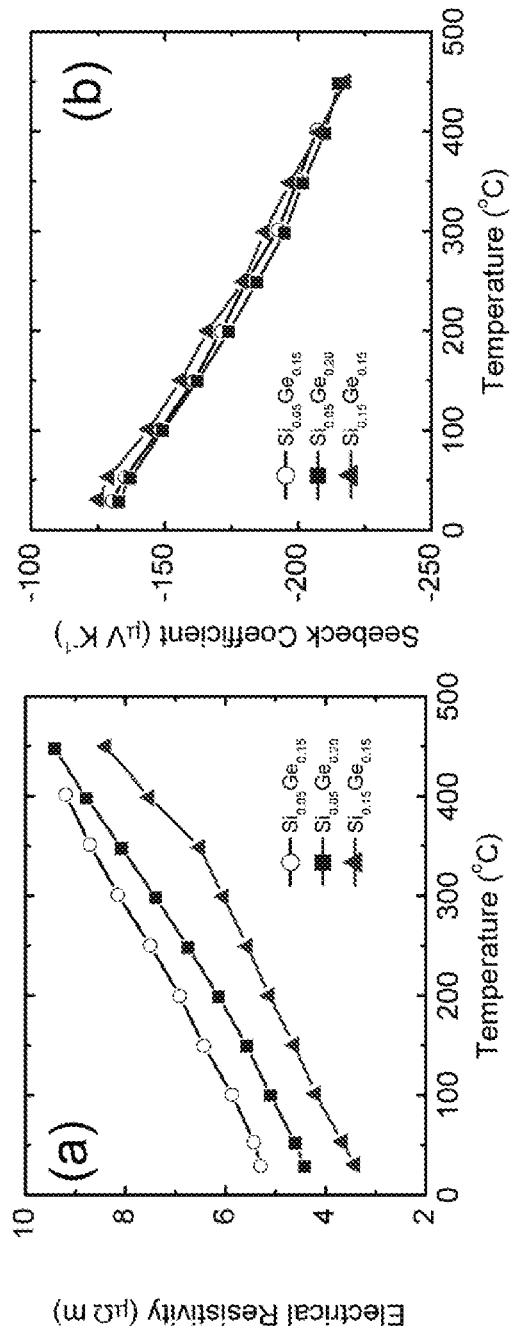
FIGS. 13A-13E are graphs of temperature-dependent thermoelectric properties of $Mg_{2+\delta}Sn_{1-x-y-z}Ge_xSi_ySb_z$ samples comprising varying amounts of Si and Ge, fabricated according to certain embodiments of the present disclosure.
Figure 13D:
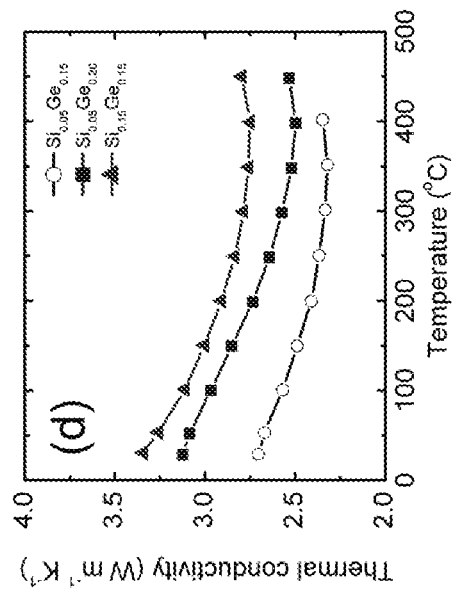
Figure 13C:
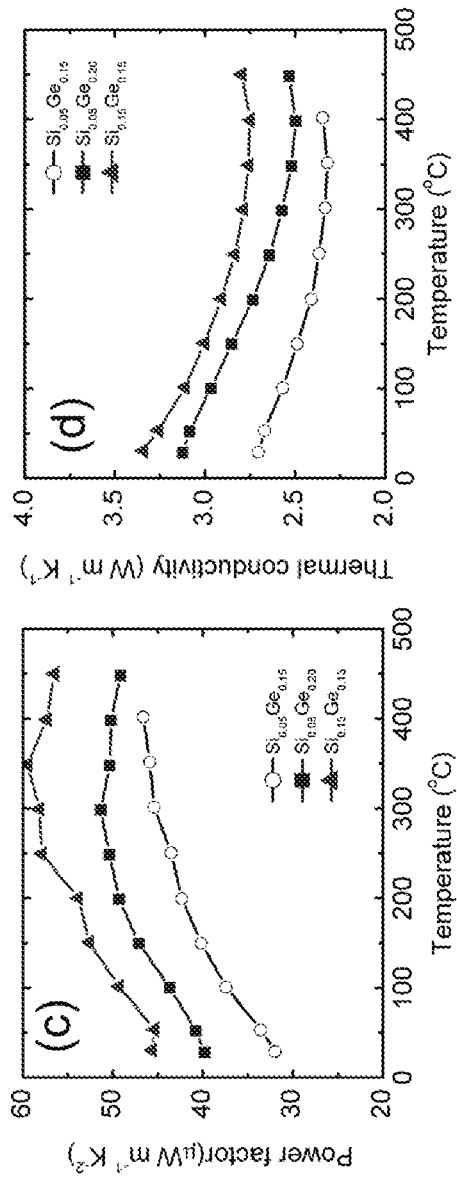
Figure 13E:
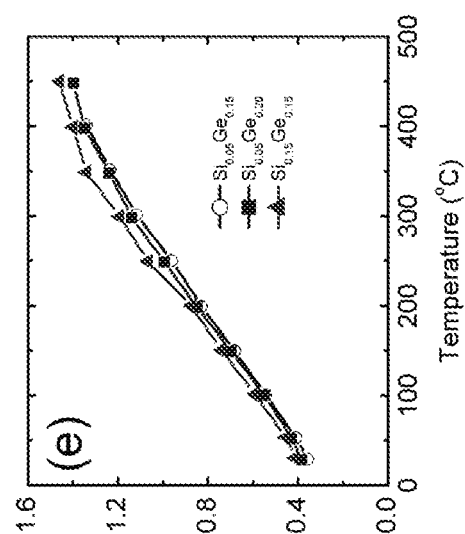

FIGS. 13A-13E show the effect of temperature and concentration of Ge and Si of Mg$_{2+\delta}$Sn$_{1-x-y-z}$Ge$_x$Si$_y$Sb$_z$ samples, where $\delta$=0.06 and z=0.02. FIG. 13A illustrates that the electrical resistivity increases with temperature and is the highest for the Si$_{0.50}$Ge$_{0.15}$ sample and lowest for the Si$_{0.15}$Ge$_{0.15}$ sample. The Seebeck coefficient (FIG. 13B) was similar for all of the samples, in contrast to the power factor (FIG. 13C), which was the highest for the Si$_{0.05}$Ge$_{0.15}$ sample, peaking at about 350° C., and lowest for the Si$_{0.15}$Ge$_{0.15}$ sample across the temperature range. The thermal conductivity is illustrated in FIG. 11D, where the highest comparative value across the temperature range was observed for the Si$_{0.015}$Ge$_{0.15}$ sample, about 2.75 Wm$^{-1}$K$^{-1}$ at about 350° C., and lowest for the Si$_{0.15}$Ge$_{0.15}$ sample, which was observed at about 2.35 Wm$^{-1}$K$^{-1}$ at about the same temperature. All of the samples exhibited a ZT (FIG. 13E) of above 1.0 at about 250° C., and above about 375° C.

Figure 14B:
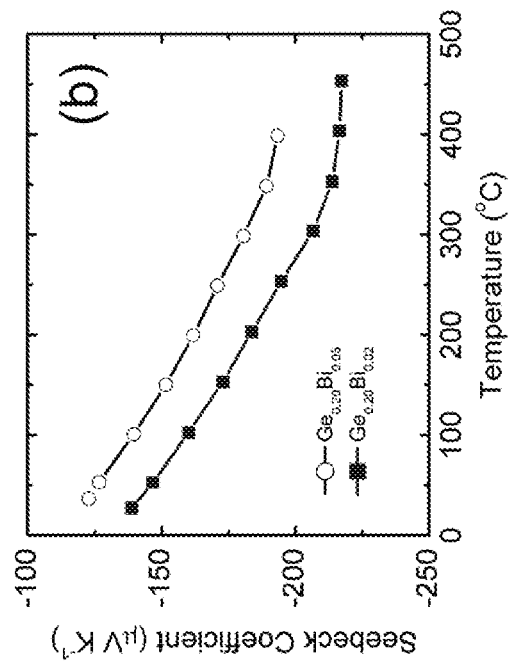
FIGS. 14A-14E are graphs of temperature-dependent thermoelectric properties of $Mg_{2+\delta}Sn_{1-x-y-z}Ge_xSi_yBi_z$ samples comprising varying amounts of Bi and Ge, fabricated according to certain embodiments of the present disclosure.
Figure 14A:
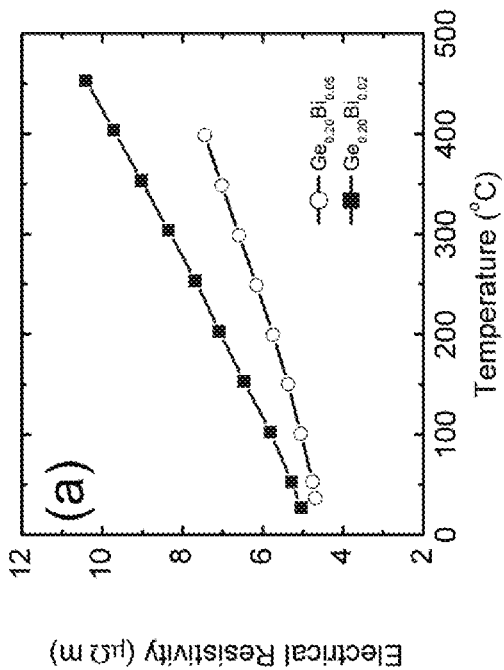
Figure 14D:
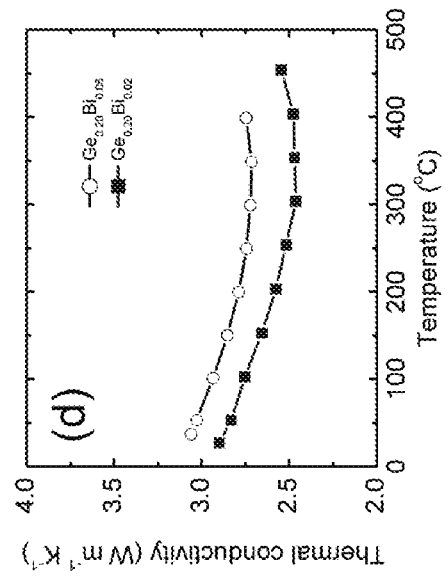
Figure 14C:
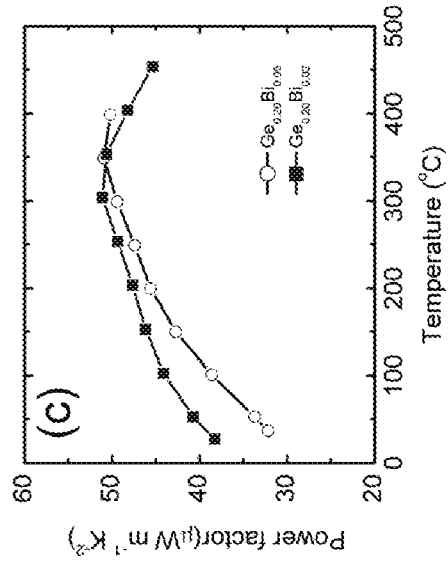
Figure 14E:
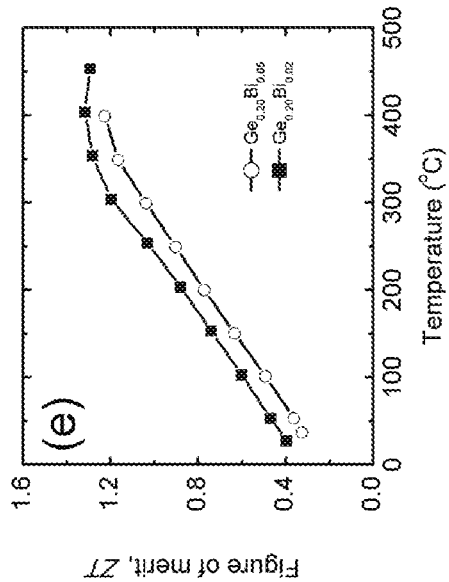

Turning now to FIGS. 14A-14E, the temperature-dependent thermoelectric properties are illustrated for samples of Mg$_{2+\delta}$Sn$_{1-x-y-z}$Ge$_x$Si$_y$Bi$_z$ fabricated according to certain embodiments of the present disclosure. In an embodiment, $\delta$=0.06 and y=0, x=0.20 and z=0.05. In alternate embodiments, x may be from about 0.01 to about 0.50, and z may be from about 0.01 to about 1.5, and in other embodiments, z is less than y, and in other embodiments, z is greater than y. FIG. 14A illustrates that the electrical resistivity of the x=0.20 and z=0.02 sample is higher than that of the sample comprising x=0.20 and z=0.05, and the Seebeck coefficient values of FIG. 14B are correspondingly inverted, with the higher value of the Seebeck coefficient belonging to the Si$_{0.02}$Bi$_{0.05}$ sample. FIG. 14C illustrates the power factor, which peaks for the Ge$_{0.20}$Bi$_{0.02}$ sample at about 50 μm$^{-1}$K$^{-2}$ at about 350° C. and for the Ge$_{0.20}$Bi$_{0.05}$ sample 50 μm$^{-1}$K$^{-2}$ at about 300° C. The thermal conductivity is illustrated in FIG. 14D, with the Ge$_{0.20}$Bi$_{0.02}$ sample having a lower thermal conductivity across the temperature range than that exhibited by the Ge$_{0.20}$Bi$_{0.05}$ sample. FIG. 14E illustrates the ZT of each sample, which is above about 1.2 the Ge$_{0.20}$Bi$_{0.02}$ sample at about 400° C. and for the Ge$_{0.20}$Bi$_{0.05}$ sample is above about 1.35 at about 400° C.

FIG. 15 is a flow chart of a method 1500 of fabricating thermoelectric materials for thermoelectric devices. At block 1502, a plurality of elements (components) according to a formula of W$_A$X$_B$Y$_{(1-B)}$, are balled-milled or otherwise reduced to a powder comprising a plurality of particles with an average particle size of less than 10 micrometers. In some embodiments, the thermoelectric material may comprise a fourth component according to the formula W$_A$X$_B$Y$_C$Z$_D$. In an embodiment, the elements are mixed to comprise a ratio of A/(B+C+D) is from about 1.4 to about 2.4, and in alternate embodiments, the ratio may be from about 1.7 to about 2.7, and in still other embodiments the ratio may be from about 1.9 to about 2.1. In some embodiments, B=1−(C−D).

In an embodiment, W comprises magnesium (Mg), calcium (Ca), strontium (Sr), barium (Ba), zinc (Zn), and/or ytterbium (Yb), and X comprises tin (Sn), germanium (Ge), silicon (Si), and/or lead (Pb), and Y (which does not represent Yttrium in this formula but rather a variable) comprises Si, Ge, Sn, Pb. In an embodiment, the first, second, and third components comprise different elements. In an embodiment where a fourth component Z is used, Z may comprise Bi, Sb, As, P, S, Se, Te, and is different than the first component, the second component, and the third component.

In an embodiment, at block 1502 the element mixtures are subjected to mechanical ball milling for up to 20 hours. At block 1504, the ball-milled powders are hot-pressed, for example, by direct current induced hot pressing at 600-750° C. for 2 minutes. In other embodiments, hot-pressing the powder at block 1504 comprises milled holding the powder at a temperature from about 500° C. to about 800° C. for a period of about 1 second to about 30 minutes. In some embodiments, subsequent to hot pressing, at block 1506, the pressed component is further processed, which may comprise annealing the pressed component from about 300° C. to about 500° C. from about 0.3 h to about 5 h. The hot-pressed component may be disposed in a thermoelectric device at block 1508 (FIG. 15) with or without the annealing or further processing at block 1506. The hot-pressed device, prior to annealing, may comprise a ZT of above 1.0.

FIGS. 16A-16F, 17A-17F, 18A-18F, 19A-19F, and 20A-20F illustrate temperature dependent thermoelectric properties of thermoelectric materials fabricated according to certain embodiments of the present disclosure.

Figure 16F:
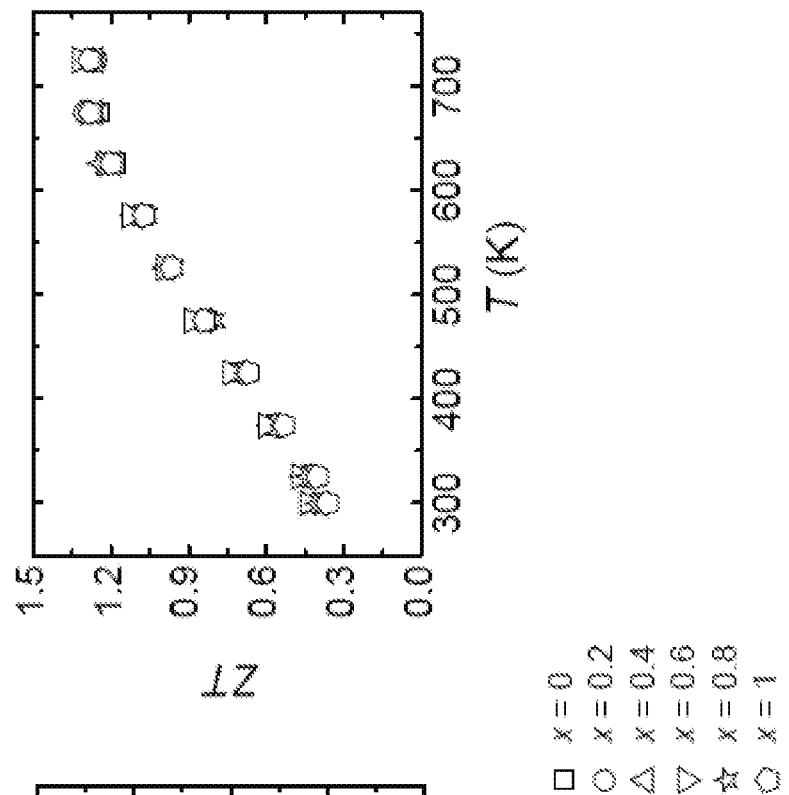
Figure 16E:
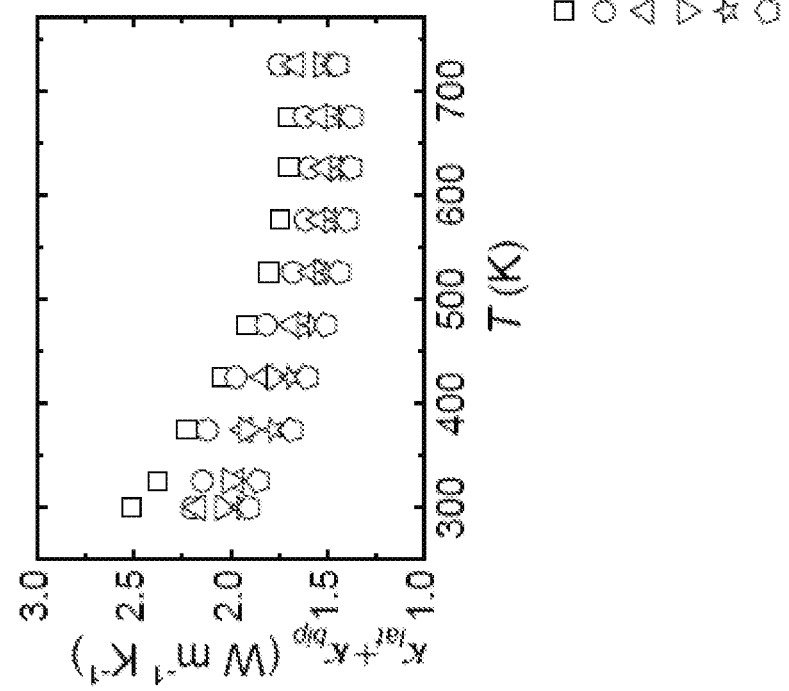

FIGS. 16A-16F are graphs of temperature-dependent thermoelectric properties of Mg$_2$(Sn$_{0.765}$Ge$_{0.22}$Sb$_{0.015}$)$_{1-x}$(Sn$_{0.685}$Si$_{0.3}$Sb$_{0.015}$)$_x$ fabricated according to certain embodiments of the present disclosure. In FIGS. 16A-16F, x=0, 0.2, 0.4, 0.6, 0.8, and 1. FIG. 16A illustrates the electrical resistivity ($\rho$), FIG. 16B illustrates the Seebeck coefficient (S) and an inset of the Seebeck coefficient vs. composition at room temperature, FIG. 16C illustrates the power factor (PF) and an inset of the PF v. composition at room temperature, FIG. 16D illustrates the total thermal conductivity (K$_{tot}$), FIG. 16E illustrates the lattice and bipolar thermal conductivity ($\kappa_{lat}+\kappa_{bip}$), and FIG. 16F illustrates the figure of merit (ZT), which is above about 0.6 from about 425 K to about 750 K (the measured temperature range) for all of the samples.

Figure 17F:
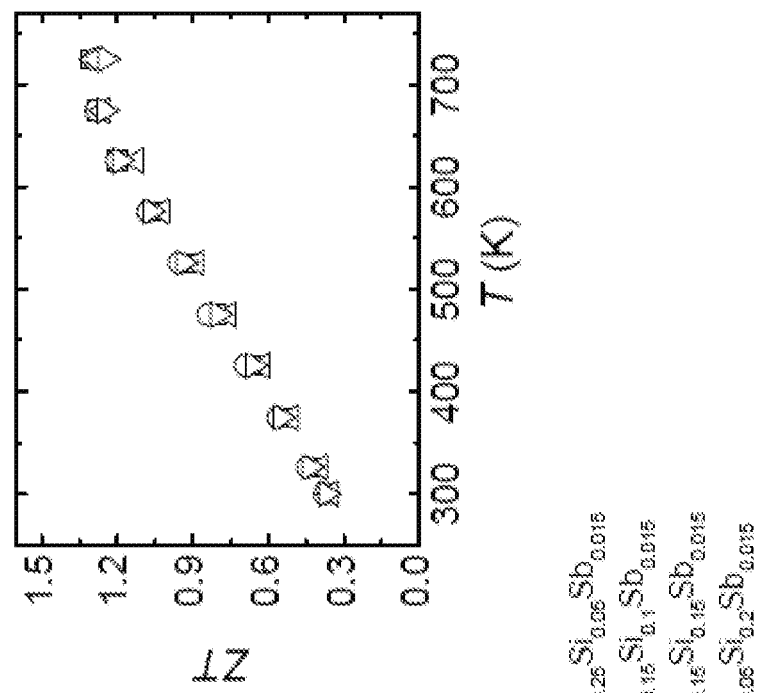
Figure 17E:
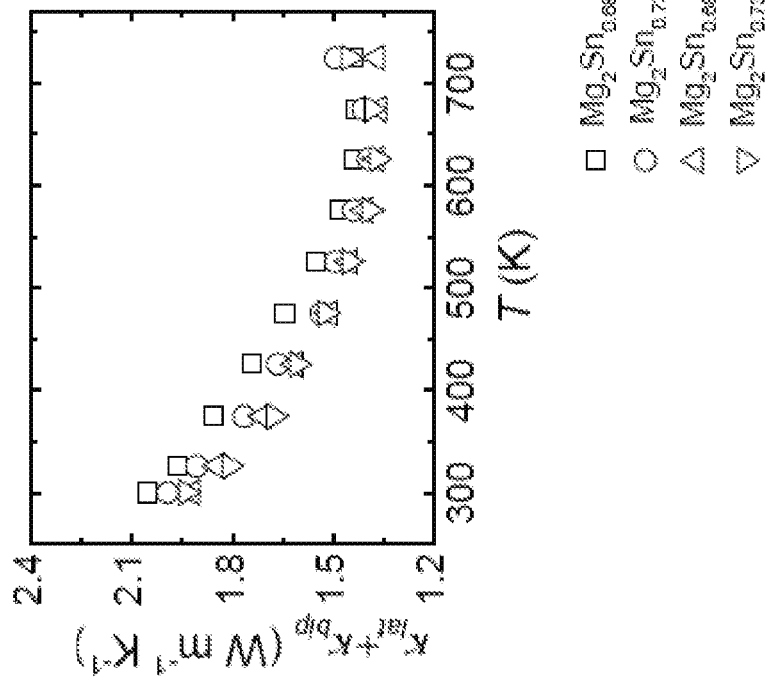

FIGS. 17A-17F are additional graphs of temperature-dependent thermoelectric properties of $Mg_2(Sn_{0.765}Ge_{0.22}Sb_{0.015})_{1-x}(Sn_{0.685}Si_{0.3}Sb_{0.015})_x$ fabricated according to certain embodiments of the present disclosure. In particular, FIGS. 17A-17F illustrate thermoelectric properties from about 300K to about 775K for $Mg_2Sn_{0.685}Ge_{0.25}Si_{0.05}Sb_{0.015}$, $Mg_2Sn_{0.735}Ge_{0.15}Si_{0.1}Sb_{0.015}$, $Mg_2Sn_{0.685}Ge_{0.15}Si_{0.15}Sb_{0.015}$, and $Mg_2Sn_{0.735}Ge_{0.05}Si_{0.2}Sb_{0.015}$, fabricated according to certain embodiments of the present disclosure. FIG. 17A illustrates the electrical resistivity (p), FIG. 17B illustrates the Seebeck coefficient (S), FIG. 17C illustrates the power factor (PF), FIG. 17D illustrates the total thermal conductivity ($\kappa_{tot}$), FIG. 17E illustrates the lattice and bipolar thermal conductivity ($\kappa_{lat}+\kappa_{bip}$), and FIG. 17F illustrates the figure of merit (ZT). The PF shown in FIG. 17C was the highest for the $Mg_2Sn_{0.735}Ge_{0.15}Si_{0.1}Sb_{0.015}$ sample, and changed similarly across the temperature range for the $Mg_2Sn_{0.685}Ge_{0.25}Si_{0.05}Sb_{0.015}$ and the $Mg_2Sn_{0.735}Ge_{0.05}Si_{0.2}Sb_{0.015}$ samples. The ZT (FIG. 17F) is above about 0.6 from 425K to about 800K for all of the samples.

FIGS. 18A-18F are graphs of temperature-dependent thermoelectric properties of $Mg_2Sn_{0.98-x}Pb_xSb_{0.02}$ fabricated according to certain embodiments of the present disclosure. In particular, the samples shown in FIGS. 18A-18F are those where x=0, 0.05, 0.1, 0.15, 0.2, and 0.25. FIG. 18A illustrates the electrical resistivity (p), FIG. 18B illustrates the Seebeck coefficient (S), FIG. 18C illustrates the power factor (PF), FIG. 18D illustrates the total thermal conductivity ($\kappa_{tot}$), FIG. 18E illustrates the lattice and bipolar thermal conductivity ($\kappa_{lat}+\kappa_{bip}$), and FIG. 18F illustrates the figure of merit (ZT). The PF in FIG. 18C is the highest for the x=0.05 sample from about 475K-775K, with the x=0 sample exhibiting values close to those values, and the lowest value of PF of the samples is for the x=0.25 sample. The ZT, as shown in FIG. 18F, is above about 0.6 from about 575K to 775K for the samples x=0, x=0.05, and x=0.1.

Figure 19F:
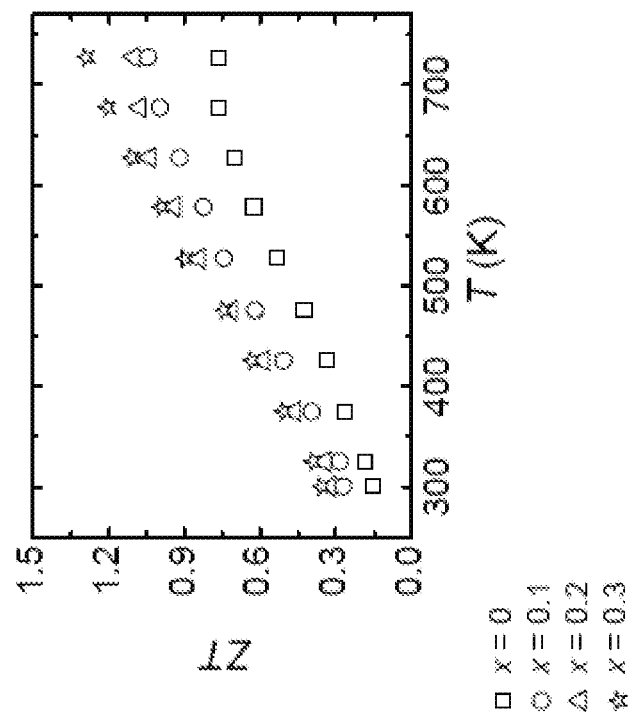
Figure 19E:
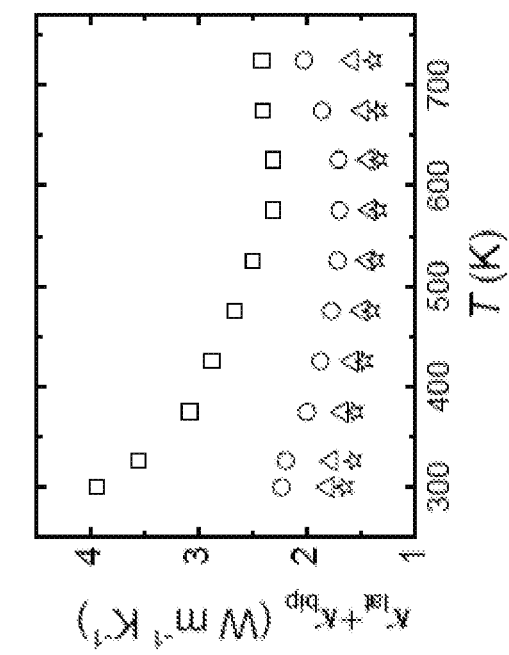

FIGS. 19A-19F are graphs of temperature-dependent thermoelectric properties of $Mg_2Sn_{0.98-x}Si_xPb_{0.05}Sb_{0.02}$ fabricated according to certain embodiments of the present disclosure. In particular, the samples in FIG. 19A-19F comprise x=0, x=0.1, x=0.2, and x=0.3. FIG. 19A illustrates the electrical resistivity (ρ), FIG. 19B illustrates the Seebeck coefficient (S), FIG. 19C illustrates the power factor (PF), FIG. 19D illustrates the total thermal conductivity ($\kappa_{tot}$), FIG. 19E illustrates the lattice and bipolar thermal conductivity ($\kappa_{lat}+\kappa_{bip}$), and FIG. 19F illustrates the figure of merit (ZT). The PF (FIG. 19C) is the highest for the x=0.1 sample from about 375K to about 775K, and the ZT is above about 0.75 for the x=0.1, x=0.2, and x=0.3 samples from about 525K to about 775K, and above 0.9 for x=0.1, x=0.2, and x=0.3 above about 625K.

Figure 20F:
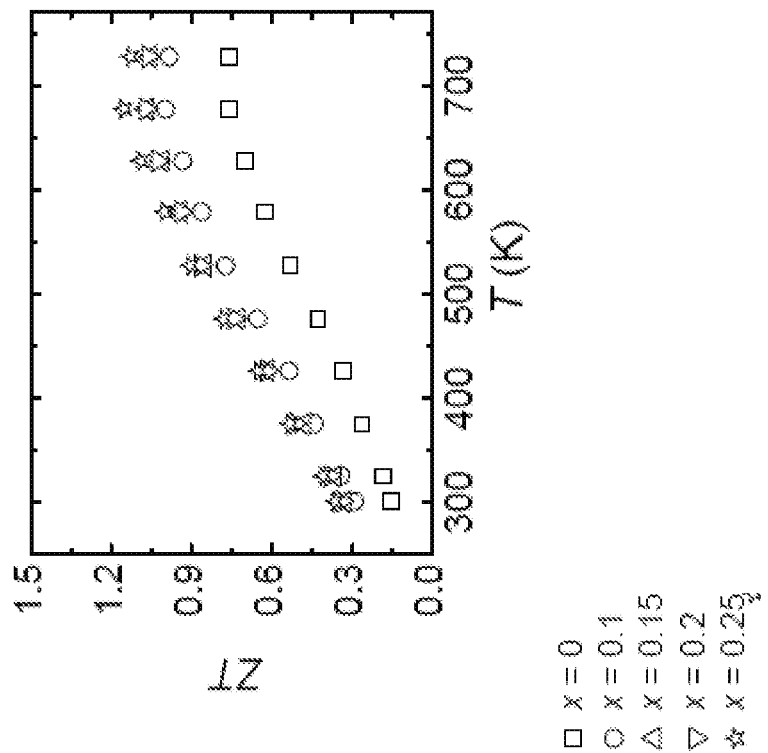
Figure 20E:
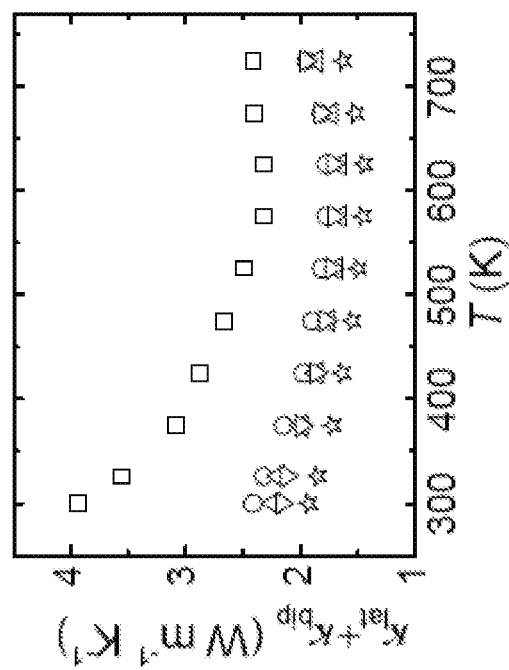

FIGS. 20A-20F are additional graphs of temperature-dependent thermoelectric properties of $Mg_2Sn_{0.98-x}Si_xPb_{0.05}Sb_{0.02}$ fabricated according to certain embodiments of the present disclosure. In particular, the samples in FIGS. 20A-20F illustrate thermoelectric properties for x=0, x=0.1, x=0.15, x=0.2, and x=0.25. FIG. 20A illustrates the electrical resistivity (p), FIG. 20B illustrates the Seebeck coefficient (S), FIG. 20C illustrates the power factor (PF), FIG. 20D illustrates the total thermal conductivity ($\kappa_{tot}$), FIG. 20E illustrates the lattice and bipolar thermal conductivity ($\kappa_{lat}$ and FIG. 20F illustrates the figure of merit (ZT). The PF, shown in FIG. 20C, is the highest for the x=0.1 sample from about 375K-775K, as in FIG. 19C, and the next-highest values are close between the x=0.15 and x=0.2 samples. The ZT, shown in FIG. 20F, is highest for the x=0.25 sample, and is above about 0.9 for the x=0.15, x=0.2, and x=0.25 samples from about 525K to about 775K.

In terms of TE material criteria of efficiency, (high ZT) plus effectiveness (high PF), in some embodiments, it may be desirable to choose the narrow band gap compounds with high symmetry crystalline structure for high degenerate energy valley values, and hence a high PF. In one example, $Mg_2X$ (X=Si, Ge, Sn) holds the cubic structure with narrow band gap. In another embodiment, which may be combined with other discussed embodiments, it may be prudent choose a heavy atom (e.g., for doping or formulation) to obtain a low (application-appropriate) $\kappa_{lat}$. In one example, using the isoelectronic compounds $Mg_2Sn$ and $Mg_2Si$, Sn is heavier than Si, so $Mg_2Sn$ should have smaller phonon group velocity, and hence lower $\kappa_{lat}$. In another embodiment, which may be combined with other discussed embodiments, it may be desirable to choose a compound with a smaller electronegativity difference between anion and cation for high carrier mobility as compared to other compounds. For this rule, $Mg_2Sn$ is comparable with $Mg_2Si$. In another embodiment, which may also be combined with other discussed embodiments, it may be desirable to balance the effect of using an alloying element on decreasing $\kappa_{lat}$ and μ. In one example, desirable thermoelectric materials may comprise a compound with a sublattice filled by two or three isoelectronic atoms, e.g., Te and Se in n-type $Bi_2Te_{2.7}Se_{0.3}$, Bi and Sb in p-type $Bi_{0.4}Sb_{1.6}Te_3$, Hf, Zr and Ti in n-type (Hf, Zr, Ti)NiSn. Conventionally, Sn is added in the $Mg_2Si$ to optimize the ZT value, while Ge is used in $Mg_2Sn$ in the instant case. The atomic size of Ge is closer to Sn than that of Si, therefore it has less impact on the carrier mobility, hence should be good for high power factor in $Mg_2Sn$. In yet another combinable embodiment, it may be desirable to utilize compositional band-crossing effect to optimize the weight mobility $\mu(m^*)^{3/2}$, and hence achieve high PF. This is a dominant effect in $Mg_2Sn_{0.75}Ge_{0.25}$ to have both high PF and ZT. Additionally in another embodiment, it may be prudent to apply the nano approaches to selectively scattering the phonons rather than electrons. This effect is also a factor in TE material performance.

Where numerical ranges or limitations are expressly stated, such express ranges or limitations should be understood to include iterative ranges or limitations of like magnitude falling within the expressly stated ranges or limitations (e.g., from about 1 to about 10 includes, 2, 2.4, 2.8, 3, 3.1, 3.5, 4, etc.; greater than 0.10 includes 0.11, 0.12, 0.13, etc., and in some embodiments "about" may mean within a range such as +/−5% or +/−10%). For example, whenever a numerical range with a lower limit, $R_l$, and an upper limit, $R_u$, is disclosed, any number falling within the range is specifically disclosed. In particular, the following numbers within the range are specifically disclosed: $R=R_l+k^*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed is:

1. A method of manufacturing an n-type thermoelectric material comprising:
    hot-pressing a powder comprising:
    a first component consisting of magnesium (Mg);
    a second component consisting of tin (Sn); and
    a third component consisting of germanium (Ge); according to the formula $Mg_2Sn_{0.75}Ge_{0.25}$ into a pressed component, wherein the pressed component comprises a ZT value of at least 1.0 at about 450° C.

2. The method of claim 1, wherein, prior to hot-pressing, the powder is formed using ball-milling.

3. The method of claim 2, wherein the powder is ball-milled for up to 20 hours.

4. The method of claim 2, wherein the powder is hot-pressed between about 600° C. and about 800° C. from about 1 second to about 30 minutes.

5. The method of claim 1, wherein the ZT value is about 1.4 at about 450° C.

6. The method of claim 1, wherein a power factor of the pressed component is from about 45 $\mu W\ cm^{-1}\ K^{-2}$ to about 55 $\mu W\ cm^{-1}\ K^{-2}$ from about 350° C. to about 450° C.

7. The method of claim 1, wherein hot-pressing the powder comprises holding the powder at a temperature from about 500° C. to about 800° C. for a period of about 1 second to about 30 minutes.

8. The method of claim 1, wherein the powder is a pure phase powder.

9. The method of claim 1, further comprising annealing the pressed component from about 300° C. to about 500° C. from about 0.3 h to about 5 h.

10. A thermoelectric device comprising:
    an n-type thermoelectric material comprising:
    a first component consisting of magnesium (Mg);
    a second component consisting of tin (Sn); and
    a third component consisting of germanium (Ge); according to the formula $Mg_2Sn_{0.75}Ge_{0.25}$ into a pressed component, wherein the pressed component comprises a ZT value of at least 1.0 at about 450° C. and a power factor of about 52 $\mu W\ cm^{-1}\ K^{-2}$ at about 25° C. to 450° C.

* * * * *

UNITED STATES PATENT AND TRADEMARK OFFICE
CERTIFICATE OF CORRECTION

PATENT NO. : 10,930,834 B2
APPLICATION NO. : 15/547374
DATED : February 23, 2021
INVENTOR(S) : Zhifeng Ren and Weishu Liu It is certified that error appears in the above-identified patent and that said Letters Patent is hereby corrected as shown below:

In the Specification

Column 1 Line 26 Please replace the Statement Regarding Federally Sponsored Research or Development as follows:
--STATEMENT REGARDING FEDERALLY SPONSORED RESEARCH OR DEVELOPMENT
This invention was made with government support under DE-SC0001299 awarded by the U.S. Department of Energy. The government has certain rights in the invention.--

Signed and Sealed this
Twenty-sixth Day of March, 2024

Katherine Kelly Vidal
*Director of the United States Patent and Trademark Office*